United States Patent [19]

Sugibayashi et al.

[11] Patent Number: 5,406,526
[45] Date of Patent: Apr. 11, 1995

[54] DYNAMIC RANDOM ACCESS MEMORY DEVICE HAVING SENSE AMPLIFIER ARRAYS SELECTIVELY ACTIVATED WHEN ASSOCIATED MEMORY CELL SUB-ARRAYS ARE ACCESSED

[75] Inventors: Tadahiko Sugibayashi; Mamoru Fujita; Isao Naritake, all of Tokyo, Japan

[73] Assignee: NEC Corporation, Tokyo, Japan

[21] Appl. No.: 129,363

[22] Filed: Sep. 30, 1993

[30] Foreign Application Priority Data

Oct. 1, 1992 [JP] Japan .................. 4-263346
Oct. 1, 1992 [JP] Japan .................. 4-263347
Feb. 10, 1993 [JP] Japan .................. 5-022230

[51] Int. Cl.$^6$ .............................................. G11C 8/00
[52] U.S. Cl. .......................... 365/230.03; 365/230.06; 365/63
[58] Field of Search .................. 365/230.03, 230.06, 365/51, 63, 194, 195

[56] References Cited

U.S. PATENT DOCUMENTS 4,972,373 11/1990 Kim et al. ............... 365/230.03 X
5,267,214 11/1993 Fujishima et al. ......... 365/230.03
5,274,597 12/1993 Ohbayashi et al. ........ 365/230.03 X

*Primary Examiner*—Joseph A. Popek
*Attorney, Agent, or Firm*—Sughrue, Mion, Zinn, Macpeak & Seas

[57] ABSTRACT

A dynamic random access memory device selects a row of memory cells from a plurality of memory cell sub-arrays with main word lines and sub-word lines for a data access, and data bits read out from the row of memory cells are amplified by a sense amplifier circuit array, wherein a row block address decoder and a column block address decoder supply a first enable signal and a second enable signal to a row of memory cell sub-arrays and a column of memory cell sub-arrays so that only one of the sense amplifier circuit arrays is powered for the amplification, thereby decreasing peak current consumed by the sense amplifier circuit arrays.

7 Claims, 22 Drawing Sheets

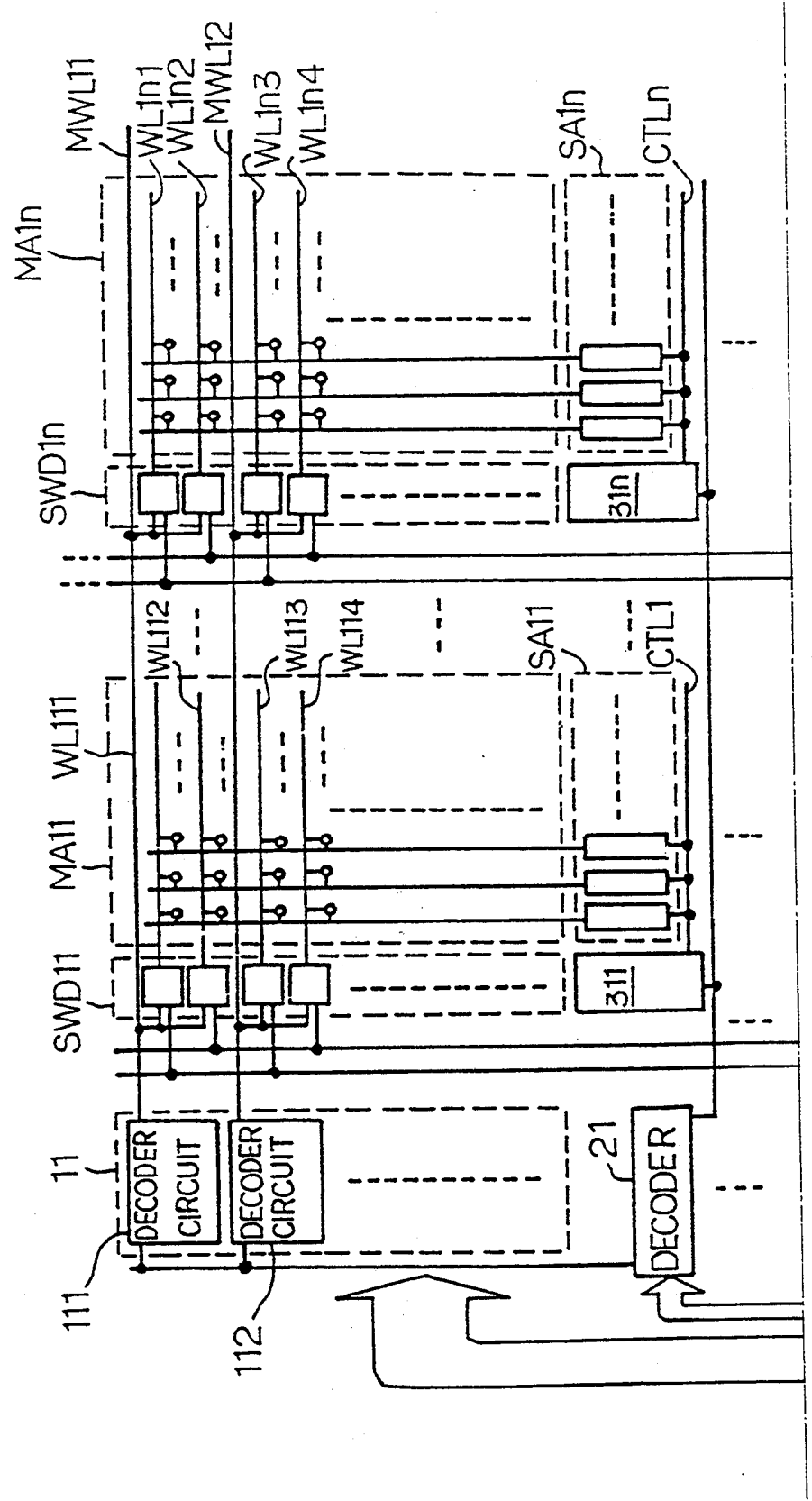

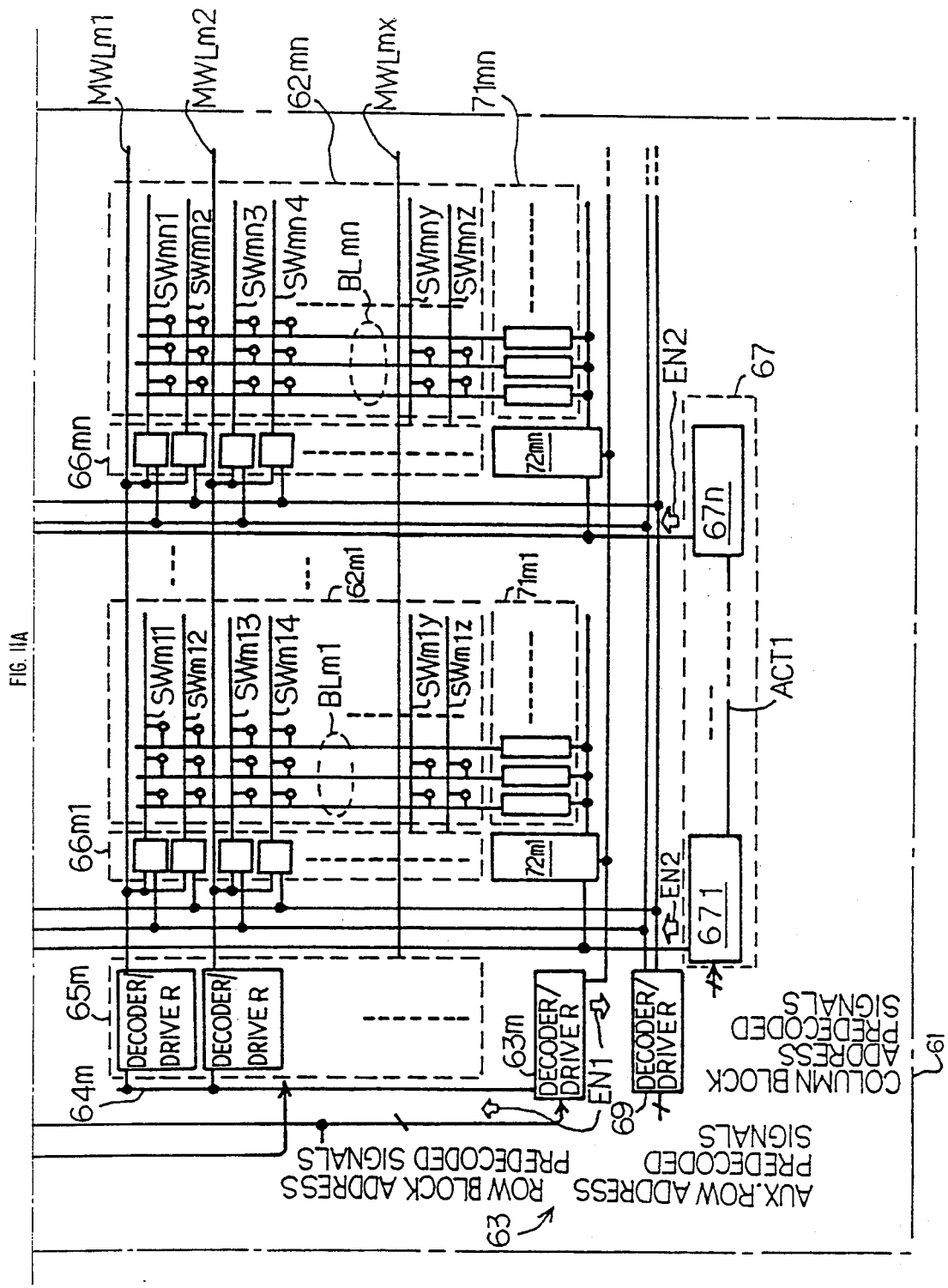

DYNAMIC RANDOM ACCESS MEMORY DEVICE HAVING SENSE AMPLIFIER ARRAYS SELECTIVELY ACTIVATED WHEN ASSOCIATED MEMORY CELL SUB-ARRAYS ARE ACCESSED

FIELD OF THE INVENTION

This invention relates to a dynamic random access memory device and, more particularly, to a dynamic random access memory device having sense amplifier arrays selectively activated when associated memory cell sub-arrays are accessed.

DESCRIPTION OF THE RELATED ART

A hierarchical word line system is attractive for a dynamic random access memory device, and FIG. 1 shows a typical example of the dynamic random access memory device incorporating the hierarchical word line system into the memory cell array. The prior art dynamic random access memory device is disclosed in Japanese Patent Application No. 4-38.

The memory cell array is constituted by a plurality of memory sub-arrays MA11, MA1n, MAm1 and MAmn arranged in matrix, and row block addresses are respectively assigned to the rows of memory cell sub-arrays MA11 to MAmn.

The rows of memory sub-arrays MA11 to MAmn are respectively associated with groups of main word lines MWL11/MWL12 to MWLm1/MWLm2, and main row addresses are respectively assigned to the main word lines of each groups. In other words, the main row addresses of the main word lines MWL1 and MWL2 are respectively identical with the main row addresses of the main word lines MWLm1 and MWLm2.

Row address decoder units 11 to 1m are respectively connected with the groups of main word lines MWL11/MWL12 to MWLm1/MWLm2, and main row address predecoded signals indicative of one of the main row addresses are distributed to the row address decoder units 11 to 1m. Row block address decoder units 21 to 2m are associated with the row address decoder units 11 to 1m, and the row block address decoder units 21 to 2m is responsive to row block address predecoded signals indicative of one of the row block addresses for enabling one of the row address decoder units 11 to 1m. For this reason, only one of the row address decoder units 11 to 1m becomes responsive to the main row address predecoded signals.

Each of the row address decoder units 11 to 1m has a plurality of decoder circuits 111/112 or 1m/1m2, and the main word lines MWL11/MWL12 or MWLm1/MWLm2 are selectively driven to a power voltage level Vdd by one of the decoder circuits 111/112 or 1m1/1m2. Namely, the main row address predecoded signals are selectively supplied to the decoder circuits 111/112 to 1ml/1m2, and one of the decoder circuits 111/112 or 1m1/1m2 of the enabled decoder unit 11 or 1m energizes one of the main word lines MWL11/MWL12 or MWLm1/MWLm2.

The memory cell sub-arrays MA11 to MAmn are further associated with respective sub-word line driver units SWD11, SWD1, SWDm1 and SWDmn and with respective sense amplifier arrays SA11, SA1n, SAm1 and SAmn. Each of the sub-word line driver units SWD11 to SWDmn is implemented by a column of word line driver circuits, and the word line driver circuits are respectively connected with sub-word lines WL111 to WL114, WL1n1 to WL1n4, WL1m1 to WL1m4 or WLmn1 to WLmn4. Auxiliary row addresses are respectively assigned to the sub-word lines of each sub-array, and each auxiliary row address is shared between sub-word lines respectively selected from the sub-word line groups associated with the memory cell sub-arrays MA11 to MAmn.

The sense amplifier arrays SA11 to SAmn are powered by respective controlling units 311 to 3mn through controlling signal lines CTL1, CTLn, CTLm and CTLmn, and the row block address decoder units 21 to 2m enables the controlling units 311/31n or 3m1/3mn associated with a row of memory cell sub-arrays MA11-/MA1n or MAm1/MAmn assigned the row block address indicated by the row block address predecoded signals. In short, the row block address predecoded signals selects one of the row address decoder units 11 to 1m and a row of controlling units 311/31n or 3m1/3mn.

An auxiliary row address decoder 4 is responsive to auxiliary row address predecoded signals indicative of one of the auxiliary row addresses, and selectively drives decoded signal lines 51 to 5x. The decoded signal lines 51 to 5x are selectively connected with the word line driver circuits incorporated in all of the sub-word line driver units SWD11 to SWDmn, and one of the decoded signal lines 51 to 5x goes up to the active high voltage level.

Each of the memory cell sub-arrays MA11 to MAmn is constituted by a plurality of memory cells represented by small circles, and the memory cells are arranged in rows and columns. The rows of memory cells are respectively connected with the associated word lines WL111 to WL114, WL1n1 to WL1n4, WL1m1 to WL1m4 or WLmn1 to WLmn4, and bit line pairs respectively connect the columns of memory cells with the associated sense amplifier array SA11, SA1n, SAm1 or SAmn. Although the bit line pairs are further connected through suitable column selector units with input/output data amplifier units, no further description is incorporated hereinbelow for the sake of simplicity.

The word line drivers incorporated in the sub-word line driver units SWD11 to SWDmn are enabled with the selected decoded signal lines 51 to 5x and the main word lines MWL11 to MWLm2, and drive the sub-word lines assigned the auxiliary row address and associated with the row of memory cell sub-arrays assigned the main row address. The memory cells connected with the selected sub-word lines are electrically conducted with the associated bit lines pairs, and small potential differences take place on the bit line pairs. The small potential differences are increased in magnitude by the associated sense amplifier arrays, and are the data bits thus amplified are restored in the memory cells again.

The dynamic random access memory device thus arranged behaves in a read-out mode and a refreshing mode as follows. Assuming now that the leftmost memory cell on the sub-ward line WL111 is accessed, the decoder unit 21 responds to the row block address predecoded signals indicative of the row block address assigned to the memory cell sub-arrays MA11 to MA1n, and enables the associated row address decoder unit 11 and the controlling units 311 to 31n.

Subsequently, the main row address predecoded signals are distributed to the row address decoder units 11 to 1m, and only the row address decoder unit 11 is responsive to the main row address predecoded signals. Then, the decoder circuit 111 decodes the main row address predecoded signals, and starts the main word line MWL11 to go up toward high voltage level Vh at time t1 of FIG. 2.

The auxiliary row address predecoded signals are supplied to the decoder unit 4, and the decoder unit 4 starts the decoded signal line 41 to go up toward the high voltage level Vh at time t2.

The main word line MWL11 and the decoded signal line 51 selects the uppermost word line drivers from the sub-ward line driver units SWD11 to SWD1n, respectively, and the uppermost word line drivers start the sub-ward lines WL111 to WL1n1 to go up to the high voltage level Vh at time t3. Then, the rows of memory cells coupled to the selected sub-word lines WL111 to WL1n1 are conducted with the associated bit line pairs, and small potential differences take place thereon.

The controlling unit 311 to 31n enabled by the decoder unit 21 start the controlling signal lines CTL1 to CTLn to go up toward the high voltage level at time t4, and the sense amplifier arrays SA11 to SA1n are powered by the controlling units 311 to 31n, respectively. Then, the small potential differences are developed or increased in magnitude by the sense amplifier arrays SA11 to SA1n, and the read-out data bits indicated by the developed potential differences are restored in the memory cells connected with the sub-word lines WL111 to WL1n1. The differential amplification is completed at time t5, and the current consumption of the sense amplifier arrays SA11 to SA1n traces Plot Is.

If the dynamic random access memory device is in the refreshing mode, the above described sequence is repeated by sequentially changing the address. On the other hand, if the dynamic random access memory device is in the read-out mode, the column selector unit (not shown) selectively transfers the read-out data bits in the form of potential difference to the input/output data amplifier units (not shown).

Thus, the prior art dynamic random access memory device makes a row of memory cell sub-arrays to become simultaneously accessible, and the associated sense amplifier arrays are concurrently powered by the controlling units. If the dynamic random access memory device is of a 16M-bit type equipped with a 4K-refreshing system, the dynamic random access memory device is expected to complete the read-out sequence and a write-in sequence within 100 to 200 nanoseconds. On the other hand, the refreshing sequence is repeated 4096 times within 64 milliseconds. This means that the dynamic random access memory device needs to complete every refreshing sequence within 16 microseconds, and 4096 sense amplifier circuits are simultaneously powered at every refreshing cycle for refreshing 4096 data bits. Such a large number of sense amplifier circuits simultaneously powered consume a large amount of current, and the power voltage line and the ground voltage line frequently fluctuate, i.e., 4096 times in 64 milliseconds. The voltage fluctuation on the power voltage line and on the ground voltage line is causative of malfunction.

However, a dynamic random access memory device is usually staying in the read-out and write-in modes more frequently than the refreshing mode, and a person may propose to fractionize the memory cell arrays for decreasing the peak current consumed in the dynamic random access memory device. The fractionalization is effective against the peak current; however, a large number of row address decoders, a large number of word line drivers and a large number of sense amplifier circuits are required by the memory cell sub-arrays increased through the fluctionalization, and the semiconductor chip must be scaled up. Therefore, there is a trade-off between the peak current and the semiconductor chip size, and this is the first problem inherent in the prior art dynamic random access memory device.

Turning to FIG. 3 of the drawings, a row of memory cell sub-arrays MA1, MA2, ... and MA8 are alternately arranged together with sub-word line driver units SWD1 to SWD8, and a row address decoder unit RD is located on the left side of the sub-word line driver unit SWD1. The memory cell sub-arrays MA1 to MA8, the sub-word line driver units SWD1 to SWD8 and the row address decoder unit RD form parts of another prior arty dynamic random access memory device similar to that disclosed by Noda et. al. in 1992 Symposium on VLSI Circuits Digest of Technical Paper, pages 112 to 113.

The row address decoder Unit RD is connected with a plurality of main word lines MWL1 to MWLm, and responsive to main row address predecoded signals for energizing one of the main word lines MWL1 to MWLm. Each of the main word lines MWL1 to MWLm is implemented by a pair of signal lines propagating true and complementary driving signals.

The main word lines MWL1 to MWLm are shared between the sub-word line driver units SWD1 to SWD8, and each of the sub-word line driver units SWD1 to SWD8 is implemented by an array of sub-word line drivers. Only two of the sub-word line drivers of the sub-word line driver unit SWD3 are shown in FIG. 3, and are labeled with DR1 and DRm, respectively.

The sub-word line drivers are respectively connected with sub-word lines, and rows of dynamic random access memory cells (not shown) are respectively activated with the sub-word lines. For example, the sub-word line drivers DR1 and DRm are respectively connected with the sub-word lines WL1 and WLn.

Though not shown in FIG. 3, auxiliary row address predecoded signals are decoded by a decoder unit, and the decoder unit selectively energizes a set of decoded signal lines AUX. An energized main word line and an energized decoded signal line select a sub-word line driver from each of the sub-word line driver unit SWD1, ... or SWD8, and the selected sub-word line drivers energize the associated sub-word lines, respectively. Therefore, a row of dynamic random access memory cells are activated in each memory cell sub-arrays, and are electrically conducted with associated bit line pairs (not shown) for access to data bits stored therein. Thus, all of the memory cell sub-arrays MA1 to MA8 allow data bits stored in the respective rows of dynamic random access memory cells to be read out to the associated bit line pairs in every access, and one of the main word lines MWL1 to MWLm and one of the decoded signal lines AUX select the row of dynamic random access memory cells from each of the memory cell sub-arrays MA1 to MA8.

All of the sub-word line drivers are identical with one another, and one of the sub-word line drivers DR$a$ incorporated in the sub-word line driver unit SWD1 is illustrated in detail in FIG. 4. Another sub-word line driver DR$b$ in FIG. 4 is incorporated in the sub-word line driver unit SWD8 at the position corresponding to the sub-word line driver DR$a$.

The sub-word line driver DRa comprises a series of n-channel enhancement type switching transistors Qn1 and Qn2 coupled between one of the decoded signal lines AUXi and a ground voltage line and an n-channel enhancement type load transistor Qn3, and the associated sub-word line SWLa is connected with the common drain node of the n-channel enhancement type switching transistors Qn1 and Qn2. The sub-word line connected with the sub-word line driver DRb is labeled with SWLb.

A pair of signal lines MWLOT and MWLON serves as the main word line MWL, and the signal lines MWLOT and MWLON are connected through the n-channel enhancement type load transistor Qn3 and directly with the gate electrodes of the n-channel enhancement type switching transistors Qn1 and Qn2, respectively. The gate electrode of the n-channel enhancement type switching transistor Qn1 is labeled with N1. A boosted voltage level Vpp higher than the power voltage level Vdd is applied to the gate electrode of the n-channel enhancement type load transistor Qn3. The signal lines MWLOT and MWLON are terminated at the sub-word line driver DRb, and the boosted voltage level Vpp is also supplied to the sub-word line driver DRb.

The sub-word line drivers DRa and DRb thus arranged behaves as follows. When the main word line is selected by the row address decoder unit RD, the row address decoder unit RD starts the signal line MWLON to go down at time t11 and the signal line MWKOT to go up toward the boosted voltage Vpp at time t12 as shown in FIG. 5. The n-channel enhancement type switching transistors Qn2 of both sub-word line drivers DRa and DRb turn off when the signal line MWLON becomes lower than the threshold thereof.

The boosted voltage level Vpp passes through the n-channel enhancement type load transistors Qn3, and the gate electrodes N1 of the n-channel enhancement type switching transistors Qn1 rise toward the voltage level (Vpp−Vth) lower than the boosted voltage level by the threshold of the load transistor Qn3 at time t13. Although the signal line MWLOT at the sub-word line driver DRa promptly reaches the boosted voltage level as indicated by a real line, the parasitic capacitance coupled with the signal line MWLOT introduces time delay into the propagation of the boosted voltage Vpp to the sub-word line driver DRb, and the signal line MWLOT at the sub-word line driver DRb reaches the boosted voltage level Vpp after substantial time delay as indicated by a broken line.

Accordingly, the gate electrode N1 of the sub-word line driver DRa promptly follows the signal line MWLOT, but the gate electrode N1 of the sub-word line driver DRb is delayed. All of the gate electrodes N1 are charged to the voltage level (Vpp−Vth) at time t14, and, thereafter, the decoder unit (not shown) starts the decoded signal line AUXi to rise toward the boosted voltage level Vpp at time t15.

Time delay is also introduced into the propagation of the boosted voltage level Vpp on the decoded signal line AUXi due to parasitic capacitance coupled therewith, and the decoded signal line at the sub-word line driver DRa starts rising at time t15. Then, self-bootstrapping phenomenon takes place, and the voltage level at the gate electrode N1 is boosted toward a voltage level (2 Vpp−Vth). Accordingly, the sub-ward line SWLa goes up toward the boosted voltage level Vpp, and reaches the boosted voltage level Vpp at time t16.

On the other hand, the decoded signal line AUXi at the sub-ward line driver DRb starts to rise toward the boosted voltage level Vpp at time t17, and the bus-ward line SWLb reaches the boosted voltage level Vpp through the self-bootstrapping phenomenon at time t18.

Using the hierarchical word line system, i.e., the sequential selection with the main and sub-word lines, a 256M-bit dynamic random access memory device is fabricated on a semiconductor chip 21 as shown in FIG. 6. Main word driver units 22a, 22b, 22c and 22d are arranged in four sub-areas on the semiconductor chip 21, and memory cell sub-arrays/sub-word line drivers 23a/23b, 23c/23d, 23e/23f and 23g/23h alternately arranged are located on both sides of each main address decoder 22a, 22b, 22c or 22d. Each of the memory cell sub-arrays/sub-word line drivers 23a to 23h is similar to the alternating arrangement shown in FIG. 3. Since the two memory cell sub-arrays/sub-word line drivers are located on both sides of each of the main address decoder unit 22a to 22d, two sets of main word lines MWLa1/MWLam and MWLb1/MWLbm extends from each main address decoder 22a, and the main word lines MWLa1/MWLam and MWLb1/MWLbm are respectively connected with the rows of sub-word line drivers represented by circles in FIG. 6.

A decoder unit 24 and an associated driver unit 25 are located in a central sub-area of the semiconductor chip 21. The decoder unit 24 is responsive to address predecoded signals (not shown), and the driver unit 25 selectively drives enable signal lines S1 and S2. The enable signal lines S1 and S2 extend along areas between the memory cell sub-arrays 23a/23b and 23e/23f and between the memory cell sub-arrays 23c/23d and 23g/23h.

Auxiliary decoder arrays 24 are provided for the memory cell sub-arrays 23a/23b, 23c/23d, 23e/23f and 23g/23h, and only one of the auxiliary decoder arrays 24 is illustrated in association with the memory cell sub-arrays 23c/23d. The auxiliary decoder array 24 is arranged along the enable signal line S2, and is connected therewith. Therefore, the auxiliary decoder array 24 is concurrently enabled with the enable signal on the enable signal line S2.

Auxiliary address predecoded signals are indicative of the auxiliary row address assigned to a sub-word line of each of the memory cell sub-arrays 23c and 23d, and are distributed to the auxiliary decoder array 24. Auxiliary driver circuits 25 are respectively coupled with the auxiliary decoder circuits of the array 24, and are connected with decoded signal lines 261 to 26i and 26j to 26x, respectively. While the enable signal line S2 enables the auxiliary decoder array 24, one of the auxiliary decoder circuits of the array 24 causes the associated auxiliary driver 25 to energize the associated decoded signal line. As described in conjunction with the sub-word line driver shown in FIG. 4, each of the decoded signal lines energized by the auxiliary driver achieves the self-bootstrapping, and the sub-word line driver lifts the high voltage level Vpp.

The sub-word line drivers are addressable with the main word lines MWLa1 to MWLam and MWLb1 to MWLbm and the decoded signal lines 261 to 26i and 26j to 26x, and sub-word lines (not shown) are respectively connected with the sub-word line drivers. Eight sub-word line drivers associated with the memory cell sub-arrays 23c and 23d are represented by small circles at the crossing points between the main word lines MWLa1 to MWLam and MWLb1 to MWLbm and the decoded signal lines 262 to 26i and 26j to 26x.

Though not shown in FIG. 6, rows of memory cells are respectively connected with the sub-word lines, and two rows of memory cells are selected from the memory cell sub-arrays 23c and 23d, respectively. Namely, the main row address decoder unit 22b energizes one of the main word lines MWLa1 to MWLam and one of the main word lines MWLb1 to MWLbm, and the enable signal line S2 allows the auxiliary decoder array 24 to select one of the decoded signal lines 26i to 26i and one of the decoded signal lines 26j to 26x. For this reason, the energized main word lines and the energized decoded signal lines cause the sub-word line drivers at the crossing points therebetween to energize the associated sub-word lines, and memory cells connected with the energized sub-word lines are conducted with bit line pairs (not shown) for data access.

The data bits read out from the memory cells produce small potential differences on the associated bit line pairs, and the small potential differences are developed or increased in magnitude by means of sense amplifier circuits (not shown). For example, if a sub-word line SWL0 is selected by the energized main word line and the energized decoded signal line, the associated sub-word line driver starts the sub-word line SWL0 to rise toward the high voltage level Vpp at time t21 in FIG. 7, a power source unit 27 supplies (see FIG. 8) positive power voltage Vcc and the ground voltage through power voltage lines SAP0 and SAN0 to the sense amplifier circuits 28 for developing the small potential differences on bit line pairs BLP. The bit line pairs BLP reach the power voltage level Vcc and the ground voltage level at time t22, and the read-out data bit represented by the large potential difference is ready for restore.

As described hereinbefore, parasitic capacitance coupled with each main word line introduces time delay into the charge of the gate electrodes N1 (see FIG. 5), and parasitic capacitance coupled with the enable signal line S2 also introduces time delay into propagation of the enable signal. The auxiliary driver must energize the decoded signal line after the charge of the gate electrodes N1 at the farthest sub-word line drivers coupled with the main word lines, and the power voltage lines SAP0 and SAN0 are energized after completion of the bootstrapping at the farthest sub-word line drivers. Thus, the time delay of the signal propagations prolongs the data access, and the total amount of time delay is 6 nanoseconds in the 256M-bit dynamic random access memory device. Since the access time of the 256M-bit dynamic random access memory device is about 30 nanoseconds, and the time delay occupies 20 per cent of the access time. This is the problem of the second prior art dynamic random access memory device.

SUMMARY OF THE INVENTION

It is therefore an important object of the present invention to provide a dynamic random access memory device which decreases a peak current flowing into sense amplifier arrays.

It is also an important object of the present invention to provide a dynamic random access memory device which is improved in access time.

To accomplish the first object, the present invention proposes to energize an sense amplifier circuit array associated with an selected memory cell sub-array.

To accomplish the second object, the present invention proposes to locate a driver at a mid point of a signal line.

In accordance with one aspect of the present invention, there is provided a semiconductor memory device comprising: a) a plurality of memory cell sub-arrays arranged in rows and columns, and each having a plurality of memory cells arranged in rows and columns, row block addresses being respectively assigned to the rows of memory cell sub-arrays, column block addresses being respectively assigned to the columns of memory cell sub-arrays; b) a row block address decoder unit responsive to row block address predecoded signals indicative of one of the row block addresses, and producing a first enable signal from the row block address predecoded signals for one of the rows of memory cell sub-arrays; c) a plurality sets of main word lines respectively associated with the rows of memory cell sub-arrays, and each having main word lines; d) a plurality of main row address decoder units respectively coupled with the plurality sets of main word lines, one of the plurality of main row address decoder units being enabled with the first enable signal for selectively driving the main word lines of the associated set in response to main row address predecoded signals; e) a column block address decoder unit responsive to column block address predecoded signals indicative of one of the column block addresses, and producing a second enable signal from the column block address predecoded signals for one of the columns of memory cell sub-arrays; f) a plurality sets of auxiliary row address decoded signal lines respectively associated with the columns of memory cell sub-arrays, and each having auxiliary row address decoded signal lines; g) a plurality of auxiliary row address decoder units respectively coupled with the plurality sets of auxiliary row address decoded signal lines, one of the plurality of auxiliary row address decoder units being enabled with the second enable signal for selectively driving the auxiliary row address decoded signal lines of the associated set to active level in response to auxiliary row address predecoded signals; h) a plurality sets of sub-word lines respectively associated with the plurality of memory cell sub-arrays, and each having sub-word lines respectively coupled with the rows of memory cells of the associated memory cell sub-array; i) a plurality of sub-word line driver units respectively associated with the plurality sets of sub-word lines, and each having a plurality of sub-word line driver circuits respectively coupled with the sub-word lines of the associated set, the main word lines of the associated set and the auxiliary row address decoded signal lines of the associated set being selectively coupled with the sub-word line drivers of one of the plurality of sub-word line driver units for driving one of the sub-word lines to active level; j) a plurality sets of data propagation paths respectively associated with the plurality of memory cell sub-arrays, and each having data propagation paths respectively coupled with the columns of memory cells of the associated memory cell sub-array; k) a plurality of sense amplifier circuit arrays respectively associated with the plurality of memory cell sub-arrays, and each having sense amplifier circuits respectively coupled with the data propagation paths of the associated set for amplifying data bits thereon; and 1) a plurality of controlling units respectively associated with the plurality of sense amplifier circuit arrays, and enabled with the first and second enable signals for supplying electric power to the associated sense amplifier circuit array.

In accordance with another aspect of the present invention, there is provided a semiconductor memory device comprising: a) a plurality of memory cell sub-arrays arranged in rows and columns, and each having a plurality of memory cells arranged in rows and columns, row block addresses being respectively assigned to the rows of memory cell sub-arrays, column block addresses being respectively assigned to the columns of memory cell sub-arrays; b) a row block address decoder unit responsive to row block address predecoded signals indicative of one of the row block addresses, and producing a first enable signal from the row block address predecoded signals for one of the rows of memory cell sub-arrays; c) a plurality sets of main word lines respectively associated with the rows of memory cell sub-arrays, and each having main word lines; d) a plurality of main row address decoder units respectively coupled with the plurality sets of main word lines, one of the plurality of main row address decoder units being enabled with the first enable signal for selectively driving the main word lines of the associated set to active level in response to main row address predecoded signals; e) a plurality of auxiliary row address decoded signal lines shared between the plurality of memory cell sub-arrays; f) an auxiliary row address decoder unit coupled with the plurality of auxiliary row address decoded signal lines, and selectively driving the auxiliary row address decoded signal lines to active level in response to auxiliary row address predecoded signals; g) a plurality sets of sub-word lines respectively associated with the plurality of memory cell sub-arrays, and each having sub-word lines respectively coupled with the rows of memory cells of the associated memory cell sub-array; h) a plurality of sub-word line driver units respectively coupled with the plurality sets of sub-word lines, and each having a plurality of sub-word line driver circuits respectively coupled with the sub-word lines of the associated set, the main word lines of each set and the auxiliary row address decoded signal lines being selectively coupled with the sub-word line drivers of one of the plurality of sub-word line driver units for driving one of the sub-word lines of each memory cell sub-arrays of one of the rows of memory cell sub-arrays to active level; i) a plurality sets of data propagation paths respectively associated with the plurality of memory cell sub-arrays, and each having data propagation paths respectively coupled with the columns of memory cells of the associated memory cell sub-array; j) a plurality of sense amplifier circuit arrays respectively associated with the plurality of memory cell sub-arrays, and each having sense amplifier circuits respectively coupled with the data propagation paths of the associated set for amplifying data bits thereon; k) a plurality of controlling units respectively associated with the plurality of sense amplifier circuit arrays, and enabled with the first enable signal and a second enable signal for supplying electric power to the associated sense amplifier circuit array; and 1) a means for supplying the second enable signal to the controlling units associated with the aforesaid one of the rows of memory cell sub-arrays having the sub-word lines driven to the active level at intervals.

In accordance with yet another aspect of the present invention, there is provided a semiconductor memory device fabricated on a single semiconductor chip, comprising: a plurality of memory cell arrays located in respective peripheral areas of a major surface of the semiconductor chip; a decoder unit located at a central area between the peripheral areas, and responsive to address predecoded signals for producing a decoded signal; first driver units each located at the central area, and responsive to the decoded signal for producing an enable signal; and a plurality of enable signal lines respectively driven by the first driver units, each of the plurality of memory cell arrays comprising a) a plurality of main word lines having respective first portions and respective second portions, b) a main row address decoder unit located in a central sub-area of one of the peripheral areas, and coupled with the first portions extending on one side thereof and with the second portions extending on the other side thereof, and responsive to main row address predecoded signals for selectively driving the plurality of main word lines, c) a first array of first memory cell sub-arrays and first sub-word line driver units alternately arranged, and located on a first sub-area of the one of the peripheral areas located on the one side of the main row address decoder unit, the first portions being selectively coupled with the first sub-word line drivers, d) a second ,array of second memory cell sub-arrays and second sub-word line driver units alternately arranged, and located on a second sub-area of the one of the peripheral areas located on the other side of the main row address decoder unit, the second portions being selectively coupled with the second sub-word line drivers, one of the first driving units being confronted with the main row address decoder unit, one of the enable signal lines having two halves respectively extending along a boundary between the first sub-area and the central area and a boundary between the second sub-area and the central area, e) a plurality of first driving signal lines extending from the central area over the first sub-area, and selectively coupling the first sub-word line driver unit for causing a self-bootstrapping phenomenon to take place in the first sub-word line driver unit, thereby selectively boosting first sub-word lines coupled therewith over a power voltage level, and f) a plurality of second driving signal lines extending from the central area over the second sub-area, and selectively coupling the second sub-word line driver unit for causing the self-bootstrapping phenomenon to take place in the second sub-word line driver unit, thereby selectively boosting second sub-word lines coupled therewith over a power voltage level, the semiconductor memory device further comprising: a plurality of control units enabled with the enable signal lines, one of the plurality of control units having a plurality of first control circuits arranged along one of the two halves of one of the enable signal lines and coupled with the one of the two halves, and a plurality of second control circuits arranged along the other of the two halves of the one of the enable signal lines and coupled with the other of the two halves; and a plurality of second driving units respectively associated with the plurality of memory cell arrays, one of the second driving units having a plurality of second driving circuits coupled with the first and second control circuits, respectively, and coupled with the driving signal lines for sequentially supplying a bootstrapping signal.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figures 9A, 9B:
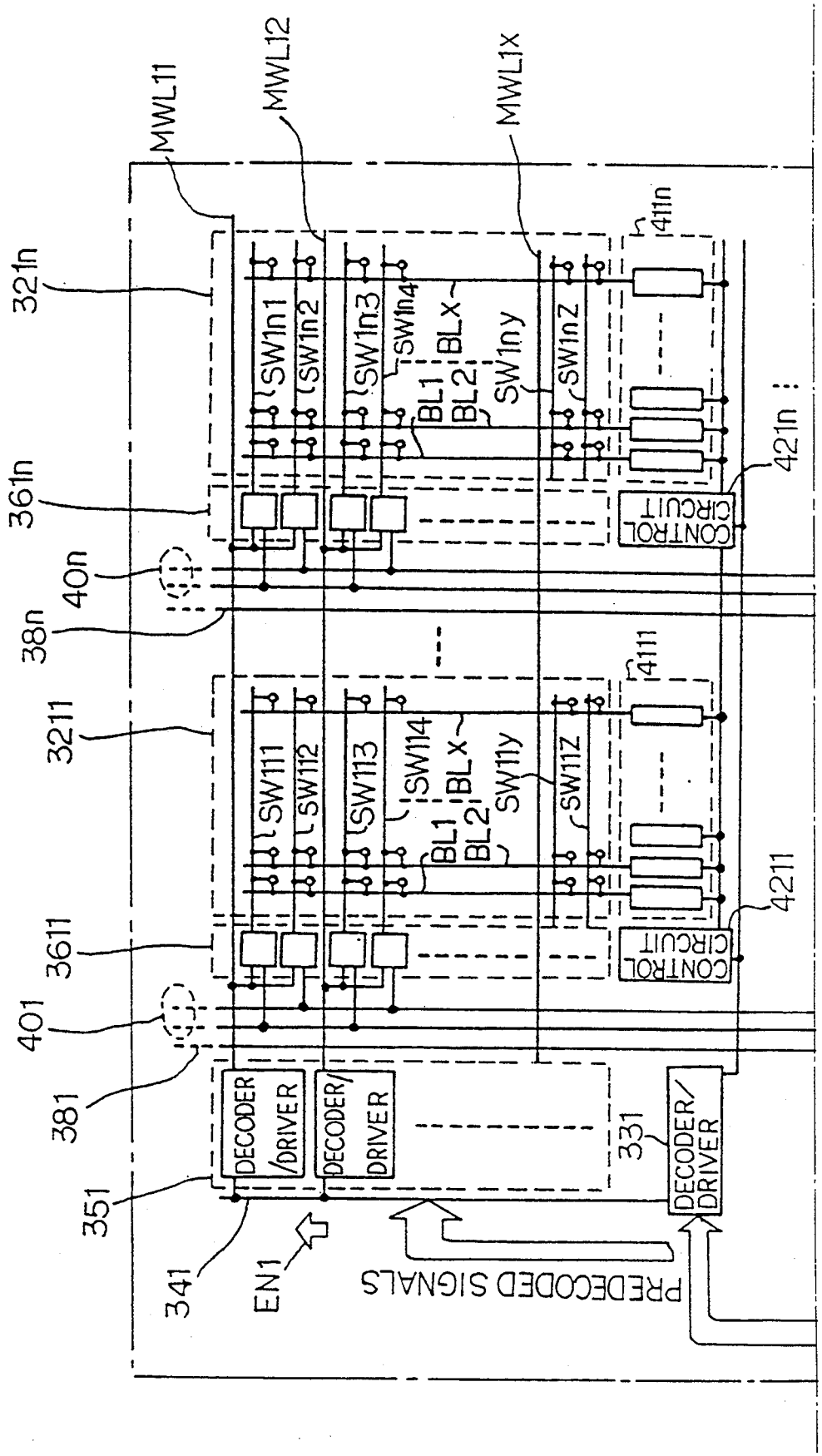
FIGS. 9A and 9B are a block diagram showing the arrangement of a dynamic random access memory device according to the present invention.
Figure 9B:
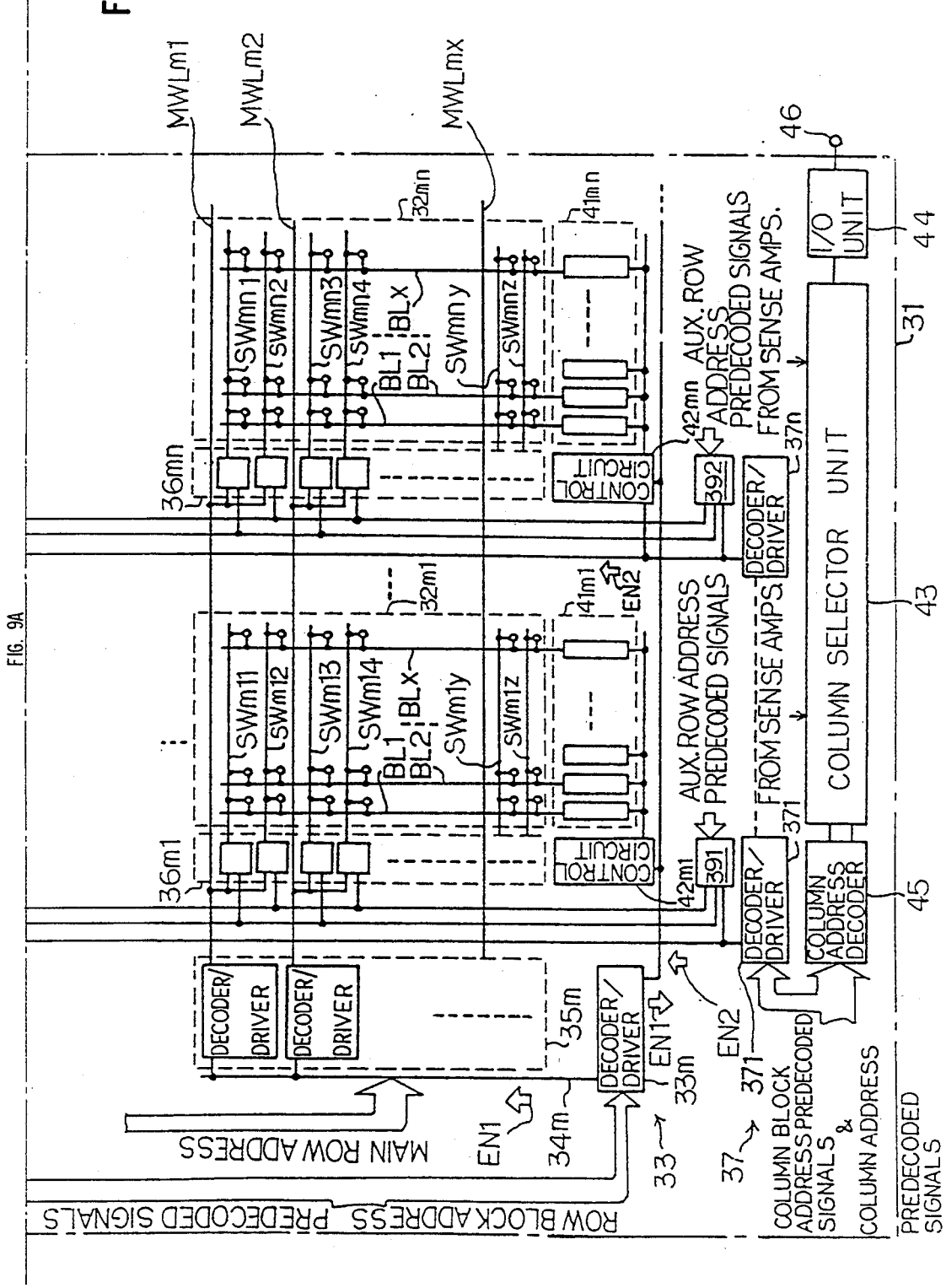

Referring to FIG. 9 of the drawings, a dynamic random access memory device embodying the present invention is fabricated on a single semiconductor chip 31. The dynamic random access memory device comprises a memory cell array broken down into a plurality of memory cell sub-arrays 3211, 321n, 32m1 and 32mn, and the plurality of memory cell sub-arrays 3211 to 32mn are arranged in matrix. The rows of memory cell sub-arrays 3211/321n to 32m1/32mn are assigned row block addresses, and row block address predecoded signals are indicative of one of the row block addresses. On the other hand, column block addresses are respectively assigned to the columns of memory cell sub-arrays 3211/32m1 to 321n/32mn, and column block address predecoded signals are indicative of one of the column block addresses.

A row block address decoder/driver unit 33 is provided for the memory cell arrays, and has a plurality of row block address decoder/driver circuits 331 to 33m respectively associated with the rows of memory cell sub-arrays 3211/321n to 32m1/32mn. Row block address decoded signal lines 341 to 34m are connected with the row block address decoder/driver circuits 331 to 33m, and one of the row block address decoder/driver circuits 331 to 33m supplies a first enable signal EN1 to the associated row block address decoded signal line. Namely, the row block address predecoded signals are distributed to the row block address decoder/driver circuits 331 to 33m, and one of the row block address decoder/driver circuits 331 to 33m is responsive to the row block address predecoded signals for producing the first enable signal EN1. In other words, the row block address decoder/driver unit 33 makes a row of memory cell sub-arrays accessible with the first enable signal EN1.

Each of the memory cell sub-arrays 3211 to 32mn has a plurality of memory cells arranged in rows and columns, and each of the memory cells is implemented by a series of an n-channel enhancement type switching transistor and a storage capacitor. Adjacent two rows of memory cells of each memory cell sub-array in the same row are grouped, and are assigned a main row address, and main row address predecoded signals are indicative of one of the main row addresses. Moreover, an auxiliary row address is assigned to every other row of memory cells of each memory cell sub-array, and auxiliary row address predecoded signals are indicative of one of the auxiliary row addresses. Each row of memory cells is addressable with the main row address and the auxiliary row address as will be described hereinbelow in detail. The columns of memory cells of each memory cell sub-array are respectively assigned column addresses, and column address predecoded signals are indicative of one of the column addresses. The memory cells are represented by small circles, respectively, in FIG. 9.

A plurality of main row address decoder/driver units 351 to 35m are respectively associated with the rows of memory cell sub-arrays 3211/321n to 32ml/32mn, and are selectively enabled with the first enable signal EN1. A plurality of decoder/driver circuits are incorporated in each of the main row address decoder/driver units 351 to 35m, and the main row address predecoded signals are supplied to all of the main row address decoder/driver units 351 to 35m.

A plurality sets of main word lines MWL11/MWL12/MWL1x to MWLm1/MWLm2/MWLmx are further associated with the rows of memory cell sub-arrays 3211/321n to 32m1/32mn and, accordingly, the main row address decoder/driver units 351 to 35m, respectively, and main word lines MWL11/MWL1x or MWLm1/MWLmx of each set are connected with the decoder/driver circuits of the associated main row address decoder/driver unit 351 or 35m. The main word lines MWL1 1/MWL1x or MWLm1/MWLmx of each set are respectively assigned the main row addresses, and one of the main word lines MWL11 Co MWL1x or MWLm1 to MWLmx is driven to active high voltage level by means of the enabled main row address decoder/driver unit. This means that two rows of memory cells are simultaneously selected from each of the memory cell sub-arrays 3211 to 321n or 32m1 to 32mn assigned the row block address indicated by the row block address predecoded signals.

A plurality of sub-word line driver units 3611, 361n, 36ml and 36mn are respectively associated with the memory cell sub-arrays 3211 to 32mn, and a plurality of driver circuits are incorporated in each of the sub-word line driver units 3611 to 36mn. The driver circuits are represented by small boxes, respectively, in FIG. 9. Adjacent two driver circuits are paired with one another, and each of the main word lines MWL11 to MWL1x or MWLm1 to MWLmx is shared between the driver pairs respectively selected from each of sub-word line driver units 3611/361n to 36m1/36mn in the same row.

A plurality sets of sub-word lines SW111 to SW11z, SW1n1 to SW1nz, SWm11 to SWm1z and SWmn1 to SWmnz are respectively associated with the plurality of memory cell sub-arrays 3211 to 32mn and, accordingly, with the sub-word line driver units 3611 to 36mn, and the sub-word lines of each set are respectively connected with the driver circuits of the associated sub-word line driver unit. The sub-word lines are respectively connected with the gate electrodes of the n-channel enhancement type switching transistors of the rows of memory cells, and bit line pairs BL1, BL2 to BLx are respectively connected with the drain nodes of the n-channel enhancement type switching transistors in the respective columns.

When a driver circuit energizes the associated sub-word line, the n-channel enhancement type switching transistors of the associated row concurrently turn on, and the n-channel enhancement type switching transistors conduct the associated storage capacitors with the bit line pairs BL1 to BLx.

A column block address decoder/driver unit 37 is provided for the memory cell array, and a plurality of column block address decoder/driver circuits 371 to 37n are incorporated in the column block address decoder/driver unit 37. The column block address decoder/driver circuits 371 to 37n are respectively associated with the columns of memory cell sub-arrays 3271/32m1 to 321n/32mn, and a plurality of column block address decoded signal lines 381 to 38n are respectively connected with the column block address decoder/driver circuits 371 to 37n. Column block address predecoded signals are distributed to the column block address decoder/driver units 371 to 37n, and a second enable signal EN2 is supplied to one of the column block address decoded signal lines 381 to 38n.

The columns of memory cell sub-arrays 3211/32m1 to 321n/32mn are further associated with auxiliary row address decoder circuits 391 to 39n, respectively, and one of the auxiliary row address decoder circuits 391 to 39n is enabled with the second enable signal EN2. A plurality sets of auxiliary row address decoded signal lines 401 to 40n are respectively coupled with the auxiliary row address decoder circuits 391 to 39n, and the auxiliary row address decoded signal lines 401 or 40n are selectively driven to the active level by means of the enabled auxiliary row address decoder circuit. Each set of auxiliary row address decoded signal lines 401 to 40n are shared between the associated column of sub-word line driver units 3611/36m1 or 361n/36mn, and are selectively connected with the driver circuits of the associated sub-word line driver units 3611/36m1 or 361n/36mn. The auxiliary row address predecoded signals are distributed to the auxiliary row address decoder circuits 391 to 39n, and one of the auxiliary row address decoder circuits enabled with the second enable signal EN2 becomes responsive to the auxiliary row address predecoded signals.

The driver circuits of each sub-word line driver unit are divided into two groups, and every other driver circuit of is distributed to one of the two groups. The remaining drivers form the other group. The groups are respectively assigned auxiliary row addresses, and are coupled with the auxiliary row address decoded signal lines, respectively. The auxiliary row address predecoded signals are indicative of one of the auxiliary row addresses.

The driver circuits of each sub-word line driver unit 3611 or 36mn are selectively enabled with the associated auxiliary row address decoded signal lines 401 or 40n, and responsive to the high voltage level on the main word lines MWL11 to MWL1x or MWLm1 to MWLmx. For example, when the row block address predecoded signals are indicative of the row block address assigned to the row of memory cell sub-arrays 3211 to 321n, the column block address predecoded signals are indicative of the column block address assigned to the column of memory cell sub-arrays 3211 to 32m1, the main row address predecoded signals are indicative of the main row address assigned to the main word lines MWL11 and MWLm1 and the auxiliary row address predecoded signals are indicative of the auxiliary row address assigned to the leftmost auxiliary row address decoded signal lines of the respective sets 401 to 40n, the main row address decoder/driver unit 351 is enabled with the first enable signal EN1, the auxiliary row address decoder circuit 391 is enabled with the second enable signal EN2, the uppermost main row address decoder/driver circuit of the unit 351 energizes the main word line MWL11 and the auxiliary row address decoder circuit energizes the leftmost auxiliary row address decoded signal line of the set 401, then the sub-word line SW111 is driven to the active high voltage level so as to read out data bits from the memory cells to the bit line pairs BL1 to BLx.

The bit line pairs BL1 to BLn of the memory cell sub-arrays 3211 to 32mn are respectively coupled with sense amplifier circuit arrays 4111, 411n, 41m1 and 41mn, and a plurality of sense amplifier circuits are incorporated in each array for the respective bit line pairs BL1 to BLx. A plurality of control circuits 4211, 421n, 42m1 and 42mn are respectively associated with the sense amplifier circuit arrays 4111 to 41mn, and are enabled with both first and second enable signals EN1 and EN2. Each of the control circuit contains a suitable power source, and the control circuit enabled with the first and second enable signals EN1 and EN2 powers the associated sense amplifier circuit array. For example, when the row block address predecoded signals are indicative of the row block address assigned to the memory cell sub-arrays 3211 to 321n and the column block address predecoded signals are indicative of the column block address assigned to the memory cell sub-arrays 3211 to 32m1, the first and second enable signals EN1 and EN2 are simultaneously supplied to the control circuit 4211, and only the sense amplifier circuit array 4111 is powered by the control circuit 4211. The control circuits 4211 to 42mn further carry out pre-charging of the bit line pairs BL1 to BLx, and control transfer gate arrays (not shown) connected between the bit line pairs BL1 to BLx and the sense amplifier circuit arrays 4111 to 41mn.

Thus, one of the sense amplifier circuit arrays 4111 to 41mn is powered by the associated control circuit, and the peak current is drastically decreased.

The sense amplifier circuit arrays 4111 to 41mn are coupled with a column selector unit 43 which in turn is coupled with an input/output unit 44. A column address decoder unit 45 is provided for the column selector unit 43, and is responsive to column address predecoded signals for controlling the column selector 43. The column selector unit 43 selectively couples the sense amplifier circuits with the input/output unit 44, and data information is transferred through the column selector unit 43 between an input/output data port 46 and the memory cell array.

The dynamic random access memory device thus arranged selectively enters into a read-out phase, a write-in phase and a refreshing phase.

In the read-out phase and the write-in phase, a memory cell coupled with the sub-word line SW111 is assumed to be accessed. The row block address decoder unit 331 is responsive to the row block address predecoded signals for supplying the first enable signal EN1 to the main row address decoder/driver unit 351 and the control circuits 4211 to 421n, and the main row address decoder/driver unit 351 drives the main word line MWL11 to the active high voltage level in response to the main row address predecoded signals.

The column block address decoder unit 371 is responsive to the column block address predecoded signals so that the second enable signal EN2 is supplied to the auxiliary row address decoder circuit 391 and the controlling circuits 4211 to 42m1. The auxiliary row address decoder circuit 391 becomes responsive to the auxiliary row address predecoded signals, and drives the leftmost decoded signal line of the set 401. Only the uppermost driver circuit of the sub-word line driver unit 3611 is coupled with the main word line MWL11 and the leftmost decoded signal line, and drives the sub-word line SW111 to the active high voltage level.

The bit line pairs BL1 to BLx have been already precharged, and data bits are read out from the memory cells coupled with the sub-word line SW111 to the bit line pairs BL1 to BLx of the memory cell sub-array 3211. Then, small potential differences take place on the bit line pairs BL1 to BLx.

Only the control circuit 4211 is enabled with the first and second enable signals EN1 and EN2, and the sense amplifier circuit array 4111 is powered by the control circuit 4211. Then, the small potential differences are developed and increased in magnitude. The read-out data bits thus amplified are restored in the memory cells coupled with the sub-word line SW111.

If the dynamic random access memory device is in the read-out phase, the column address decoder 45 causes the column selector unit 43 to selectively transfer the read-out data bits to the input/output unit 44, and the input/output unit 44 produces an output data signal which is supplied to the input/output data port 46.

On the other hand, if the dynamic random access memory device is in the write-in phase, write-in data is transferred through the column selector unit 43 to the sense amplifier circuit array 4111 in the form of potential difference, and is increased for storing memory cells coupled with the sub-word line SW111.

In the refreshing phase, the row block address predecoded signals, the column block address predecided signals, the main row address predecoded signals and the auxiliary row address predecoded signals are intenally produced, and the sub-word lines SW111 to SWmn4 are sequentially driven to the active high voltage level. However, only one of the sub-word lines SW111 to SWmn4 is selected on a single refreshing cycle, and data bits are read out to the bit line pairs BL1 to BLx. Only one of the control circuits 4211 to 42mn is enabled with the first and second enable signals EN1 and EN2 in the refreshing cycle, and the sense amplifier circuit array amplifies the read-out data bits. The read-out data bits thus amplified are restored in the memory cells.

As will be appreciated from the foregoing description, the dynamic random access memory device according to the present invention powers only one of the sense amplifier circuit array, and peak current flowing into the sense amplifier circuit array is decreased. As a result, the power voltage line and the ground voltage line are stable, and any malfunction hardly takes place.

Second Embodiment

Figure 10A:
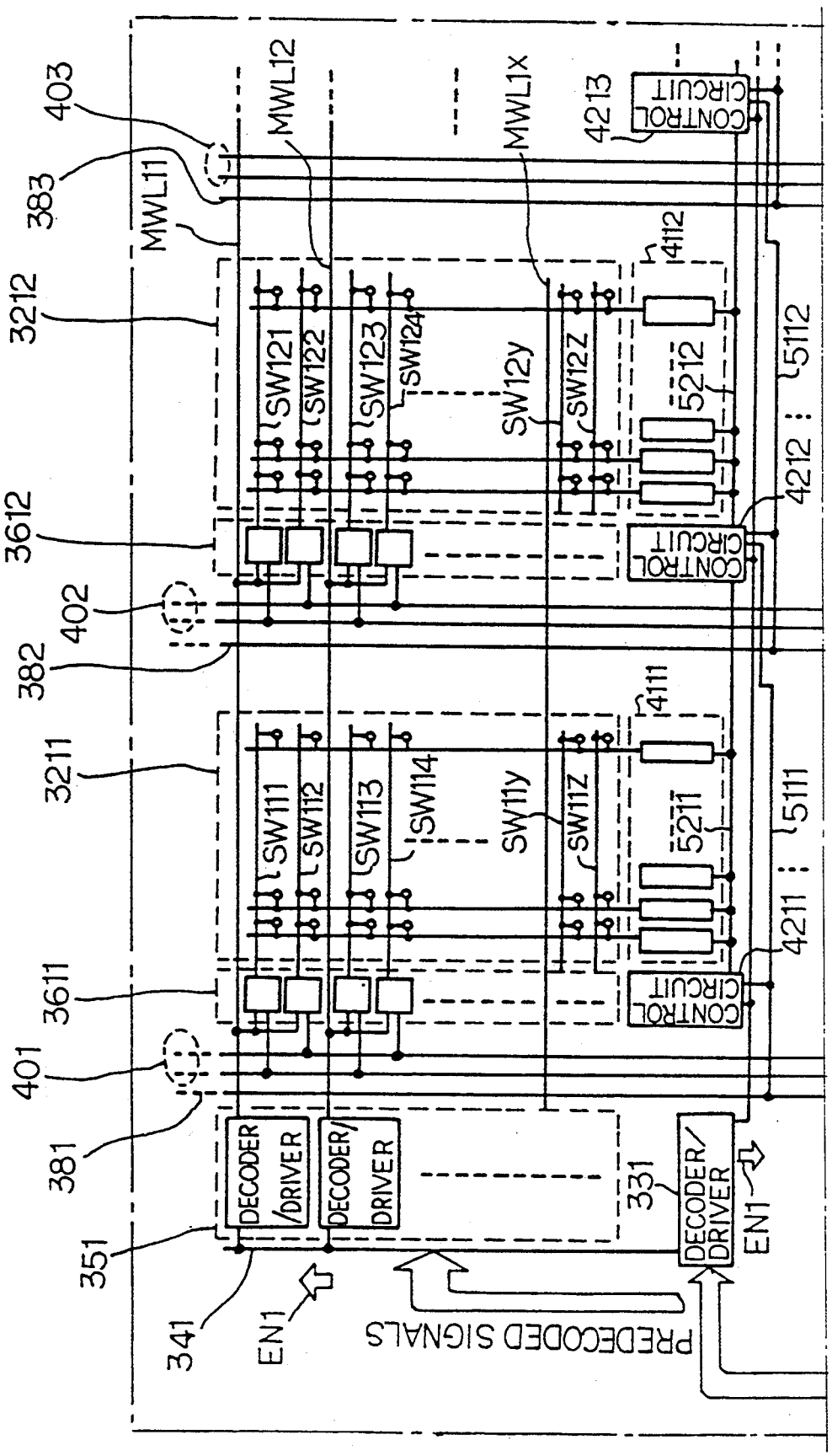
FIGS. 10A and 10B are a block diagram showing the arrangement of another dynamic random access memory device according to the present invention.
Figure 10B:
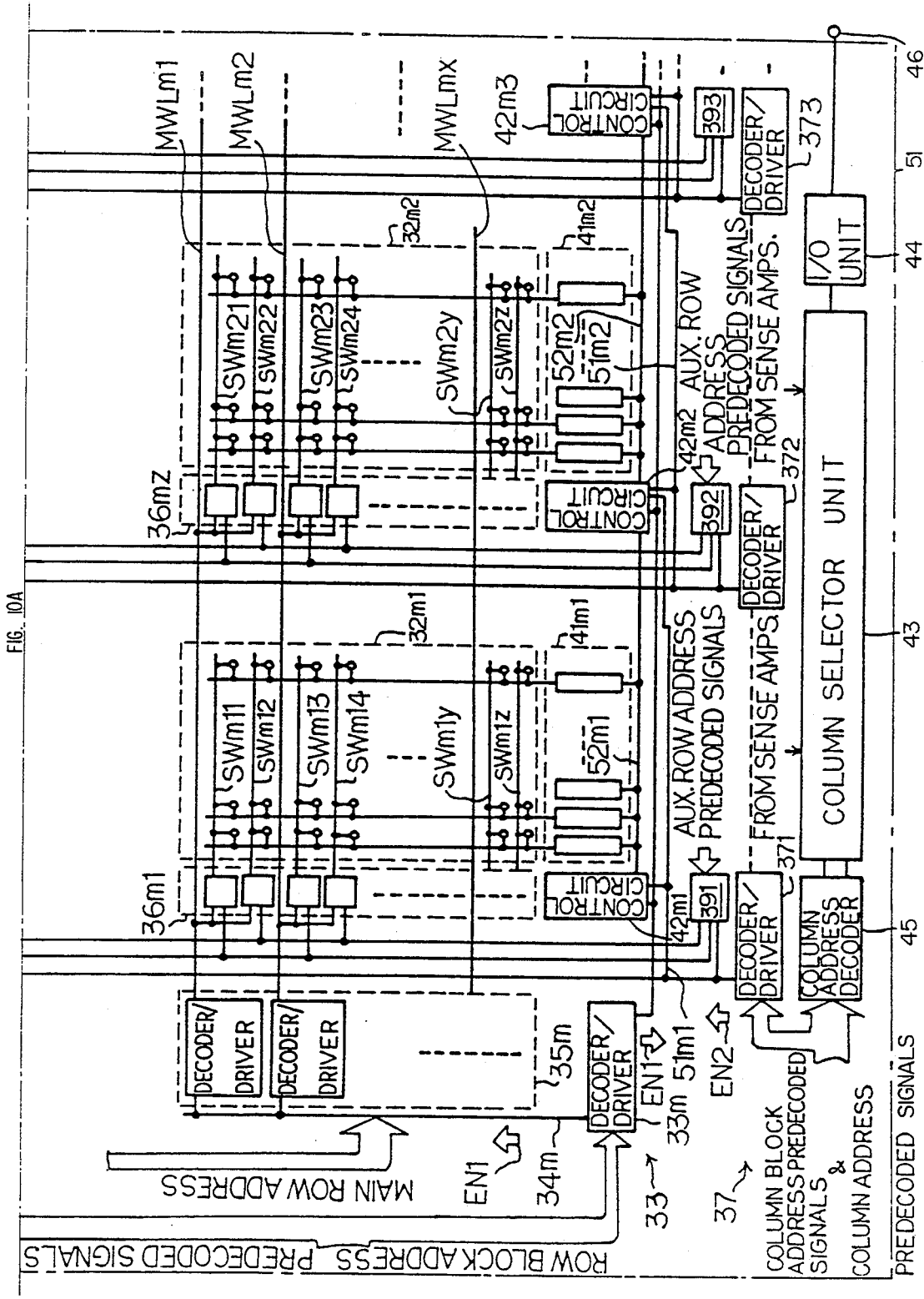

Turning to FIG. 10 of the drawings, another dynamic random access memory device embodying the present invention is fabricated on a semicoductor chip 51; however, only two columns of memory cell sub-arrays 3611, 3612, 36m1 and 36m2 and assoicated peripheral circuits are shown in FIG. 10. The arrangement of the dynamci random accesss memory device shown in FIG. 10 is similar to the first embodiemnt except for auxiliary column block address decoded signal lines 5111, 5112, 51m1, 51m2 . . . and power supply lines 5211, 5212, 52m1, 52m2 . . . , and, for this reason, the other component units and signa lines are labled with like references designating corresponding component units and signal lines of the first embodiemnt without detailed description.

The auxiliary column block decoded signal lines 5111, 5112, 51ml, 51m2, . . . are respectively assoicated with the memory cell sub-arrays 3211, 3212, 32m1, 32m2, . . . exept for the memory cell sub-arrays in the rightmost column, and are brached from the associated column block address decoded signal lines 381, 382, . . . leach of the auxiliary column block decoded signal lines 5111, 5112, 51m1, 51m2, . . . is coupled with the control circuit 4212, 42m2, . . . assoicated with the memory cell sub-array in the next column of memory cell sub-array in the same row, and propagating the second enable signal EN2 thereto, if any. For example, the auxiliary column block address decoded signal line 5111 is coupled between the column block address decoded signal line 381 and the control circuit 4212. Thus, the control circuits 4212, 42m2, . . . except for those in the leftmost column can be enabled with the first enable signal EN1 and the second enable signal EN2 supplied from any one of the adjacent two column block address decoder/driver circuits.

The power supply lines 5211, 5212, 52m1, 52m2, ... are respectively assoiciated with the sense amplifier circuit arrays 4111, 4112, 41m2, 41m2, ..., and each of the power supply lines is coupled between the assoiated sense amplifier circuit array and the adjacent two control circutis. For example, the power supply line 5211 is coupled between the sense ampifiler circut array 4111 and the control circuits 4211 and 4212 adjacent to each other.

In the second embodiemnt, one of the sense amplifier circuit arrays 4111, 4112, 41m1, 41m2, ... is powered for amplifying the read-out data bits as similar to the first embodiment. However, the selected sense amplifier circuit array is powered by the adjacent two control circuits, and the sense amplifier circuit array rapidly increases the potential differences indicative of the read-out data bits. For example, if the sub-word line SW111 is driven to the active high voltage level, the first enable signal EN is supplied to the control circuits 4211, 4212, .., and the second enable signal EN2 is supplied to the column block address decoded signal line 381. The second enable signal EN2 is supplied to not only the control circuit 4211 but also the control circuit 4212, and the second enable signal EN2 on the auxiliary column block address decoded signal line 5111 teaches the control circuit 4212 that the sense amplifier circuit array 4111 should be powered. Then, the control circuits 4211 and 4212 drives the power supply line 5211, and the sense amplifier circuit array 4111 rapidly develops the small potential differences on the bit line pairs BL1 to BLx, because the current driving capability is twice as large as that of the first embodiment.

Third Embodiment

Figures 11A, 11B:
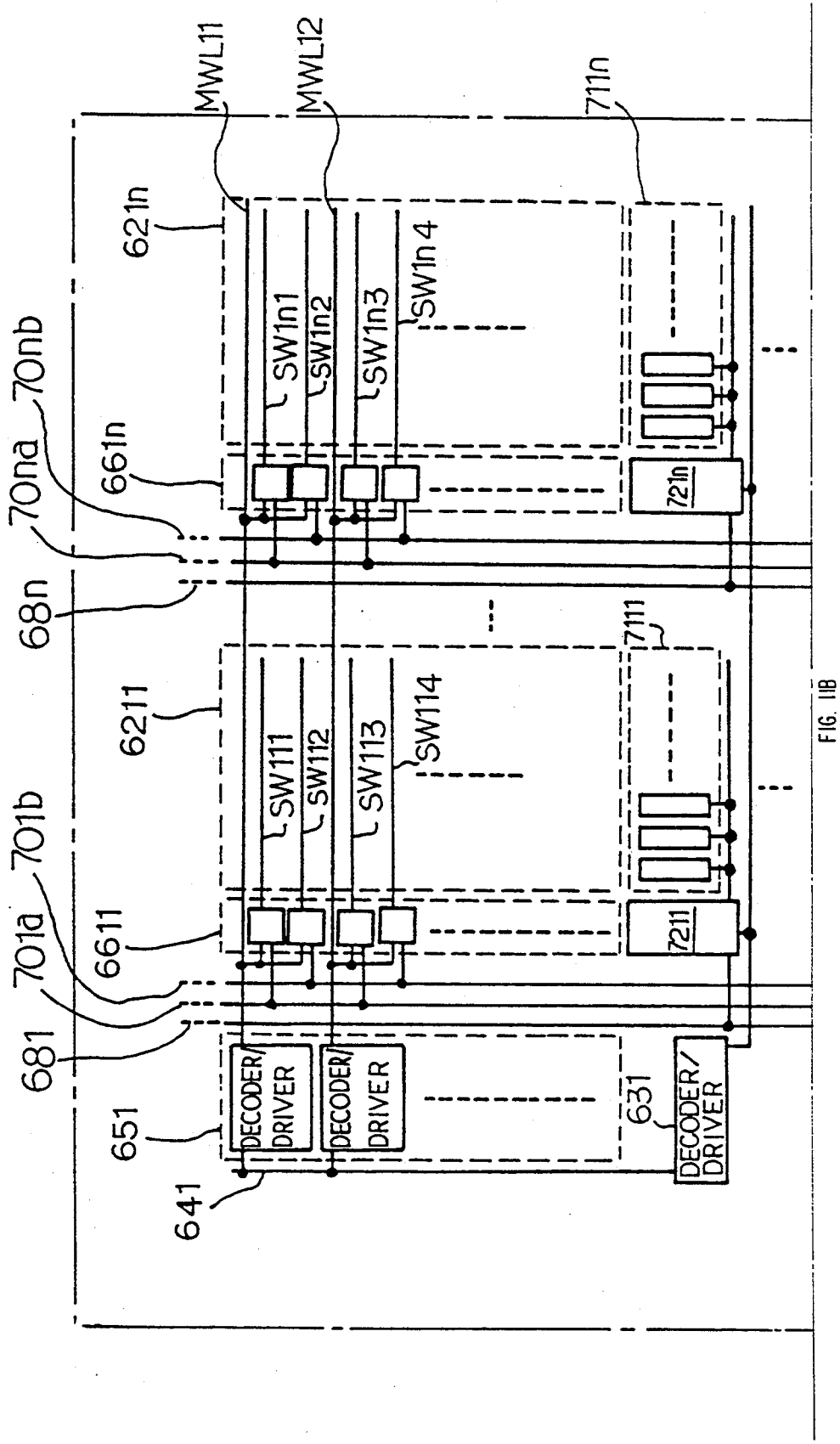
FIGS. 11A and 11B are a block diagram showing the arrangement of yet another dynamic random access memory device according to the present invention.

Turning to FIG. 11 of the drawings, yet another dynamic random access memory device embodying the present invention is fabricated on a semiconductor chip 61. The dynamic random access memory device comprises a memory cell array broken down into a plurality of memory cell sub-arrays 6211, 621n, 62m1 and 62mn, and the plurality of memory cell sub-arrays 6211 to 62mn are arranged in matrix. The rows of memory cell sub-arrays 6211/621n to 62m1/62mn are assigned row block addresses, and row block address predecoded signals are indicative of one of the row block addresses. On the other hand, column block addresses are respectively assigned to the columns of memory cell sub-arrays 6211/62m1 to 621n/62mn, and column block address predecoded signals are indicative of one of the column block addresses.

A row block address decoder/driver unit 63 is provided for the memory cell arrays, and has a plurality of row block address decoder/driver circuits 631 to 63m respectively associated with the rows of memory cell sub-arrays 6211/621n to 62m1/62mn. Row block address decoded signal lines 641 to 64m are connected with the row block address decoder/driver circuits 631 to 63m, and one of the row block address decoder/driver circuits 631 to 63m supplies a first enable signal EN1 to the associated row block address decoded signal line. Namely, the row block address predecoded signals are distributed to the row block address decoder/driver circuits 631 to 63m, and one of the row block address decoder/driver circuits 631 to 63m is responsive to the row block address predecoded signals for producing the first enable signal EN1. In other words, the row block address decoder/driver unit 63 makes a row of memory cell sub-arrays accessible with the first enable signal EN1.

Each of the memory cell sub-arrays 6211 to 62mn has a plurality of memory cells arranged in rows and columns, and each of the memory cells is implemented by a series of an n-channel enhancement type switching transistor and a storage capacitor. Small circles are indicative of the memory cells. Each of the rows of memory cells of each memory cell sub-array is addressable with a main row address and an auxiliary row address, and the main row address and the auxiliary row address are represented by main row address predecoded signals and auxiliary row address predecoded signals.

A plurality of main row address decoder/driver units 651 to 65m are respectively associated with the rows of memory cell sub-arrays 6211/621n to 62m1/62mn, and are selectively enabled with the first enable signal EN1. A plurality of decoder/driver circuits are incorporated in each of the main row address decoder/driver units 651 to 65m, and the main row address predecoded signals are supplied to all of the main row address decoder/driver units 651 to 65m.

A plurality sets of main word lines MWL11/MWL12/MWL1x to MWLm1/MWLm2/MWLmx are further associated with the rows of memory cell sub-arrays 6211/621n to 62m1/62mn and, accordingly, the main row address decoder/driver units 651 to 65m, respectively, and main word lines MWL11/MWL1x or MWLm1/MWLmx of each set are connected with the decoder/driver circuits of the associated main row address decoder/driver unit 651 or 65m. The main word lines MWL11/MWL1x or MWLm1/MWLmx of each set are respectively assigned the main row addresses, and one of the main word lines MWL11 to MWL1x or MWLm1 to MWLmx is driven to active high voltage level by means of the enabled main row address decoder/driver unit. This means that two rows of memory cells are selected from each of the memory cell sub-arrays 6211 to 621n or 62ml to 62mn assigned the row block address indicated by the row block address predecoded signals.

A plurality of sub-word line driver units 6611, 661n, 66m1 and 66mn are respectively associated with the memory cell sub-arrays 6211 to 62mn, and a plurality of driver circuits are incorporated in each of the sub-word line driver units 6611 to 66mn. The driver circuits are represented by small boxes, respectively, in FIG. 11. Adjacent two driver circuits are paired with one another, and each of the main word lines MWL11 to MWL1x or MWLm1 to MWLmx is shared between the driver pairs respectively selected from each of sub-word line driver units 6611/661n to 66m1/66mn in the same row.

A plurality sets of sub-word lines SW111 to SW11z, SW1n1 to SW1nz, SWm11 to SWm1z and SWmn1 to SWmnz are respectively associated with the plurality of memory cell sub-arrays 6211 to 62mn and, accordingly, with the sub-word line driver units 6611 to 66mn, and the sub-word lines of each set are respectively connected with the driver circuits of the associated sub-word line driver unit. The sub-word lines are respectively connected with the gate electrodes of the n-channel enhancement type switching transistors of the rows of memory cells, and bit line pairs BL11, BL1n, BLm1 or BLmn are respectively connected with the drain nodes of the n-channel enhancement type switching transistors in the respective columns. Column addresses are respectively assigned to the columns of memory cells and the bit line pairs of each memory cell sub-array.

When a driver circuit energizes the associated sub-word line, the n-channel enhancement type switching transistors of the associated row concurrently turn on, and the n-channel enhancement type switching transistors conduct the storage capacitors with the bit line pairs BL11, BL1n, BLm1 or BLmn.

A column block address decoder/driver unit 67 is provided for the memory cell array, and has a plurality of column block address decoder/driver circuits 671 to 67n. Column block address decoded signal lines 681 to 68n are respectively coupled with the column block address decoder/driver circuits 671 to 67n, and one of the column block address decoder/driver circuits 671 to 67n is responsive to column block address predecoded signals for driving the associated column block address decoded signal line with a second enable signal EN2. The column, block address decoded signal lines 681 to 68n are respectively associated with the columns of memory cell sub-arrays 6211/62m1 to 621n/62mn, and propagate the second enable signal EN2.

The column block address decoder/driver circuits 671 to 67n are sequentially coupled through activation signal lines ACT1 with one another. Namely, every adjacent two column block address decoder/driver circuits are coupled through one of the activation signal lines ACT1, and the activation signal lines ACT1 sequentially allow all of the column block address decoder/driver circuits 671 to 67n to produce the second enable signal once in a refreshing cycle as described hereinbelow in detail. Namely, when the dynamic random access memory-device enters into a refreshing phase, the column block address predecoded signals internally produced cause the column block address decoder/driver circuit 671 to firstly produce the second enable signal EN2, and the column block address decoder/driver circuit 671 activates the adjacent decoder/driver circuit on the right side thereof by mans of the activation signal line ACT1 after predetermined lapse of time from the production of the second enable signal EN2. Then, the adjacent column block address decoder/driver circuit thus activated produces the second enable signal EN2.

In this way, each of the column block address decoder/driver circuits sequentially activates the adjacent column block address decoder/driver circuit on the right side thereof, and the column block address decoder/driver circuit 67n finally produces the second enable signal EN2.

Additionally, if the column block address decoder/driver circuit 67n is further coupled through an activation signal line with the column block address decoder/driver circuit 671, the sequential activation is achieved not only the refreshing phase but also read-out and write-in phases. Moreover, a timing generator may be exclusively used for the sequential activation of the control circuits.

An auxiliary row address decoder unit 39 is coupled with a plurality of auxiliary row address decoded signal lines 70a and 70b, and is responsive to auxiliary row address predecoded signals for driving one of the auxiliary row address decoded signal lines 70a and 70b to the active high voltage level. The auxiliary row address decoded signal lines 70a and 70b are shared between all of the memory cell sub-arrays 6211 to 62mn, and auxiliary row addresses are respectively assigned to the auxiliary row address decoded signal lines 70a and 70b. Namely, the auxiliary row address decoded signal line 70a is coupled with every other driver circuit of each of the sub-word line driver units 6611 to 66mn, and the remaining driver circuits are coupled with the other auxiliary row address decoded signal line 70b.

Using the main word lines and the auxiliary row address decoded signal lines, one of the sub-word lines is selected from each of the memory cell sub-arrays in one of the rows. For example, when the row block address predecoded signals are indicative of the row block address assigned to the row of memory cell sub-arrays 6211 to 621n, the main row address predecoded signals are indicative of the main row address assigned to the main word lines MWL11 and MWLm1 and the auxiliary row address predecoded signals are indicative of the auxiliary row address assigned to the auxiliary row address decoded signal line 70a, the sub-word lines SW111 to SW1n1 are simultaneously driven to the active high voltage level so as to read out data bits from the memory cells to the bit line pairs BL11 to BL1n.

The bit line pairs BL11 to BLmn are respectively coupled with sense amplifier circuit arrays 7111, 711n, 71m1 and 71mn, and a plurality of sense amplifier circuits are incorporated in each array for the respective bit line pairs BL11, BL1n, BLm1 or BLmn. A plurality of control circuits 7211, 721n, 72m1 and 72ran are respectively associated with the sense amplifier circuit arrays 7111 to 71mn, and are enabled with the second enable signal EN2. Each of the control circuits 7211 to 72mn contains a suitable power source, and the control circuit enabled with the second enable signal-EN2 powers the associated sense amplifier circuit array. The control circuits 4211 to 42mn further carry out pre-charging of the bit line pairs BL1 to BLx, and control transfer gate arrays (not shown) connected between the bit line pairs BL1 to BLx and the sense amplifier circuit arrays 4111 to 41mn.

As described hereinbefore, the column block address decoder/driver circuits 671 to 67n sequentially produces the second enable signal EN2 in the refreshing cycle. For this reason, control circuits associated with a row of memory cell sub-arrays are sequentially supplied with the second enable signal EN2, and the associated sense amplifier circuit arrays 7111 to 711n are sequentially powered by the control circuits for amplifying the read-out data bits on the bit line pairs.

Thus, a row of sense amplifier circuit arrays are not concurrently powered in the refreshing phase, and peak current flowing into the sense amplifier circuit arrays is decreased.

Though not shown in FIG. 11, the sense amplifier circuit arrays 7111 to 71mn are coupled with a column selector unit which in turn is coupled with an input/output unit. A column address decoder unit (not shown) is provided for the column selector unit, and is responsive to column address predecoded signals for controlling the column selector. The column selector unit selectively couples the sense amplifier circuits with the input/output unit, and data information is transferred through the column selector unit between an input,-/output data port and the memory cell array.

The dynamic random access memory device thus arranged selectively enters into a read-out phase, a write-in phase and a refreshing phase.

In the refreshing phase, the memory cells coupled with the sub-word lines SW111 to SW1n1 are assumed to be refreshed, and the row block address predecoded signals, the column block address predecoded signals, the main row address predecoded signals and the auxiliary row address predecoded signals are internally produced.

Figure 12:
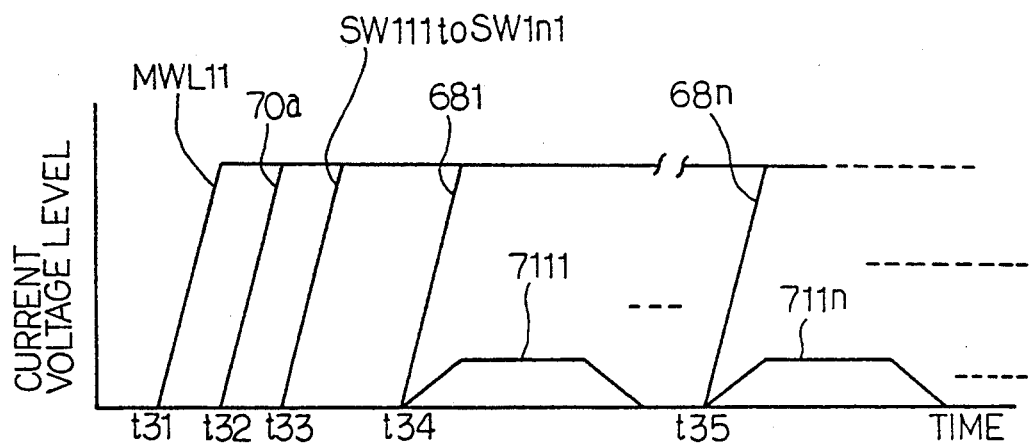
FIG. 12 is a graph showing the waveforms of essential signals in a refreshing phase and the current flowing into sense amplifier circuit arrays of the dynamic random access memory device according to the present invention.

The row block address decoder unit 631 is responsive to the row block address predecoded signals for supplying the first enable signal EN1 to the main row address decoder/driver unit 651 and the control circuits 7211 to 721n, and the main row address decoder/driver unit 651 drives the main word line MWL11 to the active high voltage level at time t31 (see FIG. 12) in response to the main row address predecoded signals.

The auxiliary row address decoder circuit 69 is responsive to the auxiliary row address predecoded signals, and drives the decoded signal line 70a at time t32. The uppermost driver circuits of the sub-word line driver units 6611 to 661n are coupled with the main word line MWL11 and the decoded signal line 70a, and drives the sub-word lines SW111 to SW1n1 to the active high voltage level at time t33. The bit lines BL11 to BL1n have already charged and balanced, and date bits are read out from the memory cells coupled with the sub-word lines SW111 to SW1n1. Then, small potential differences take place on the bit line pairs BL11 to BL1n.

The column block address decoder/driver circuit 671 is responsive to the column block address predecoded signals so that the second enable signal EN2 is firstly supplied from column block address decoder/driver circuit 671 the through the decoded signal line 681 to the control circuits 7211 to 72m1. Only the control circuit 7211 is enabled with the first enable signal EN1, and the sense amplifier circuit array 7111 is powered by-the control circuit 7211 at time t34. The small potential differences on the bit line pairs BL11 are developed or increased in magnitude by the sense amplifier circuit array 7111, and the sense amplifier circuit array 7111 consumes current labeled with "7111" in FIG. 12.

The column block address decoder/driver circuit 671 energizes the activation signal line coupled with the adjacent decoder/driver circuit on the right side thereof, and the adjacent column block address decoder/driver circuit supplies the second enable signal EN2 to the control circuit associated with the adjacent memory cell sub-array on the right side of the sub-array 6211. Then, the sense amplifier circuit array associated with the adjacent memory cell sub-array is powered, and the small potential differences are developed by the sense amplifier circuit array.

Thus, the second enable signal EN2 is sequentially supplied to the control circuits associated with the first row of the memory cell sub-arrays, and the column block address decoder/driver circuit 67n finally supplies the second enable signal EN2 to the control circuit 721n. The sense amplifier circuit array 711n is powered with the control circuit 721n at time t35, and the small potential differences on the bit line pairs BL1n is developed. The current flowing into the sense amplifier circuit array 711n is labeled with "711n". The read-out data bits thus sequentially amplified by the sense amplifier circuit arrays 7111 to 711n are restored into the memory cells coupled with the sub-word lines SW111 to SW1n1, and the row block address predecoded signals, the main row address predecoded signals and the auxiliary row address predecoded signals sequentially increment the row block address, the main row address and the auxiliary row address.

Figures 1A, 1B:
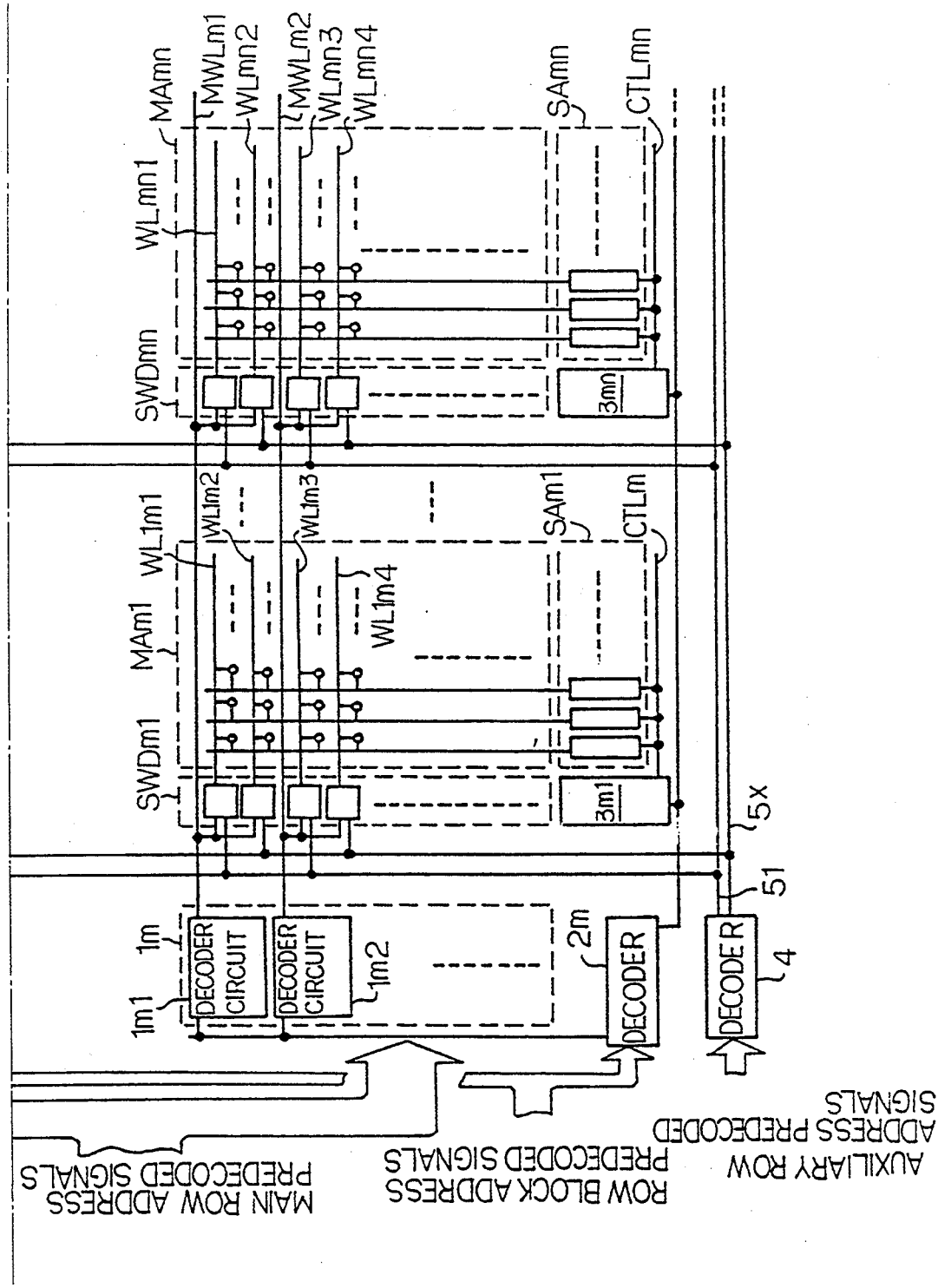
FIGS. 1A and 1B are a block diagram showing the arrangement of the prior art dynamic random access memory device incorporating the hierarchical word line system in the memory cell sub-arrays.
Figure 2:
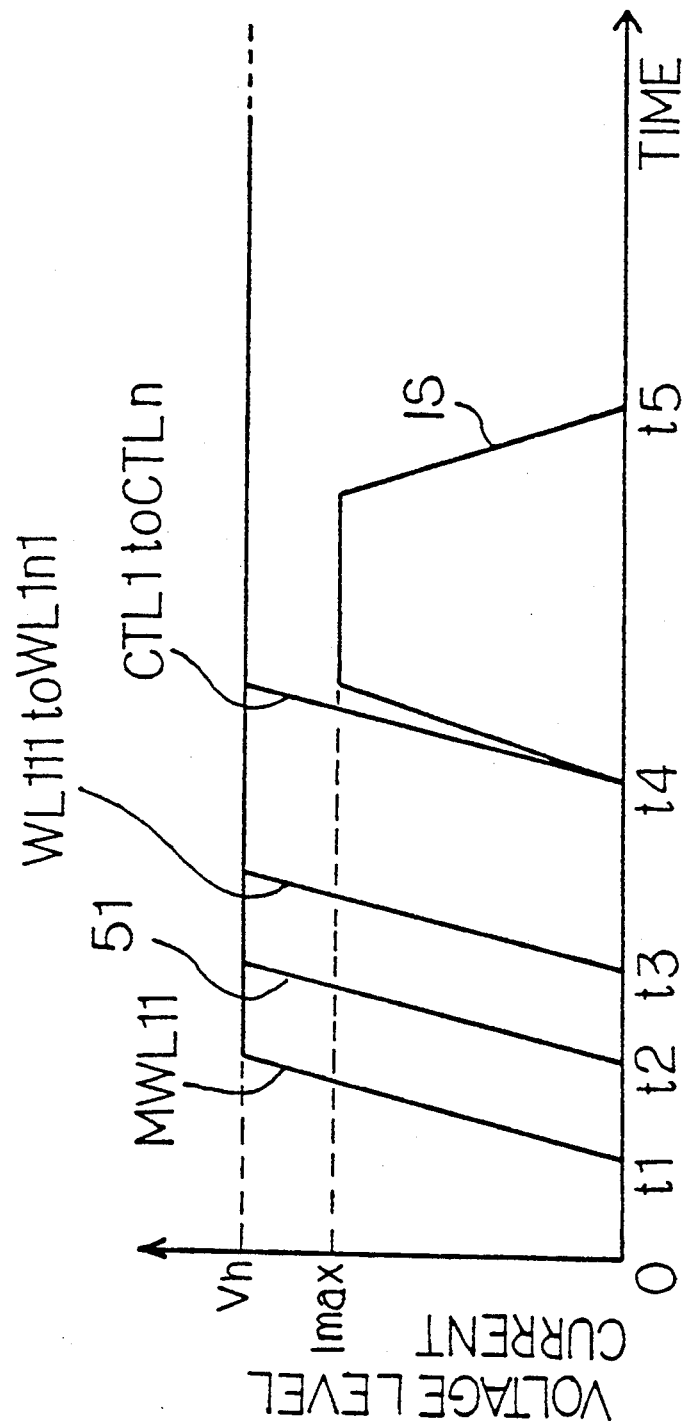
FIG. 2 is a graph showing the waveforms on the essential signal lines of the prior art dynamic random access memory device.
Figure 3:
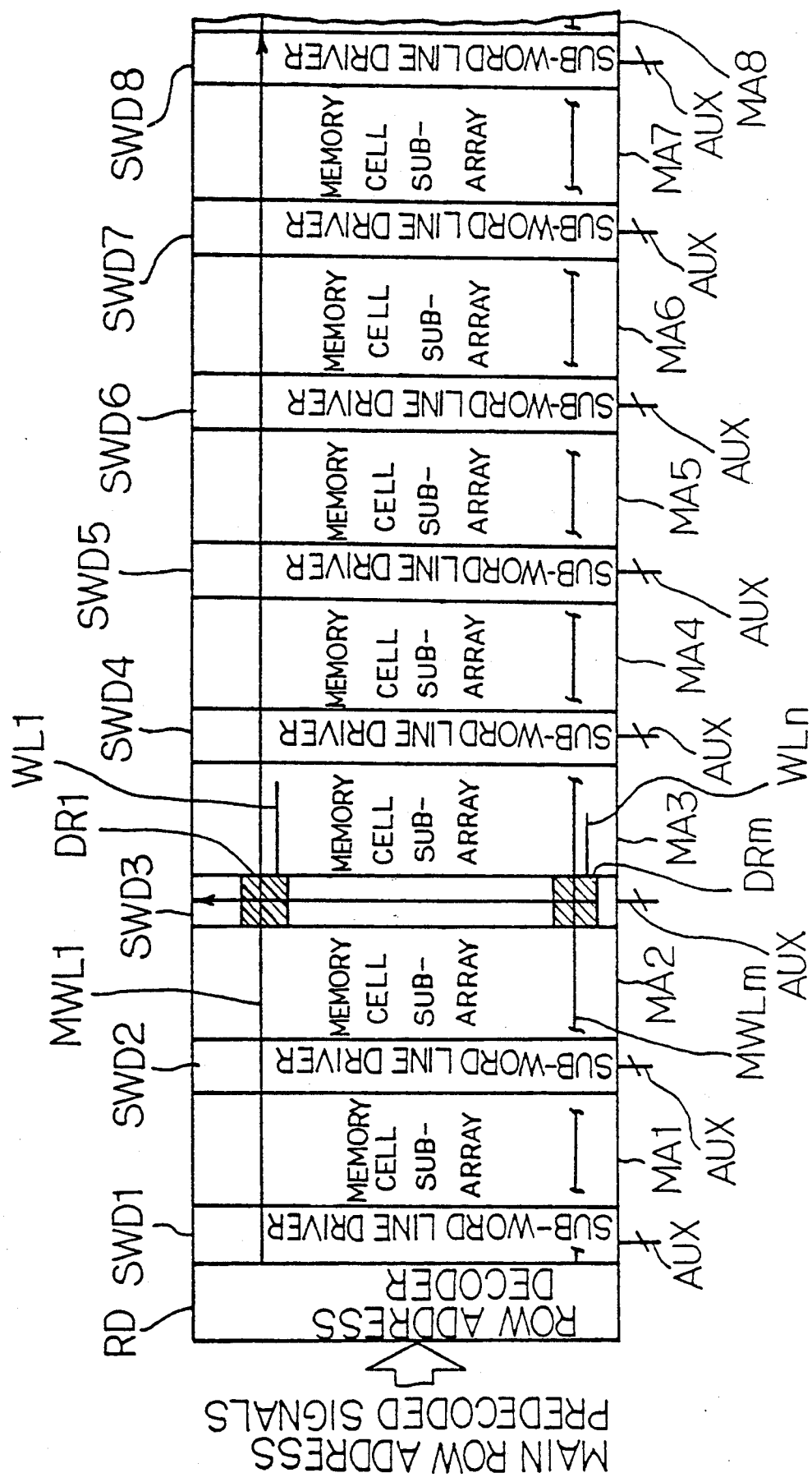
FIG. 3 is a block diagram showing the arrangement of another prior art dynamic random access memory device.
Figure 13:
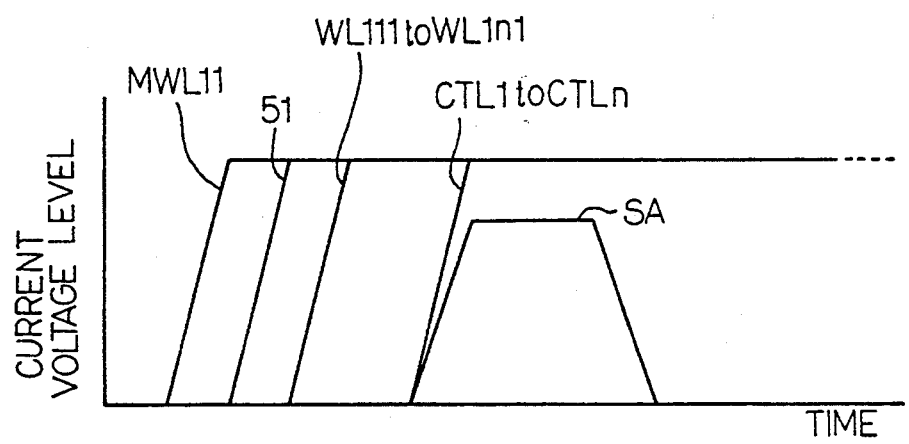
FIG. 13 is a graph showing the waveforms of the essential signals in the refreshing phase and the current flowing into the sense amplifier circuit arrays of the prior art dynamic random access memory device shown in FIG. 1.

FIG. 13 shows the waveforms on the main word line MWL11, the decoded signal line 51, the sub-wrod lines WL111 to WL1n1 and the power supply lines CTL1 to CTLn of the prior art dynamic random access memory device shown in FIG. 1, and the current flowing into the sense amplifier circuit arrays Sa11 to SA1n is labeled with "SA". Comparing FIG. 13 with FIG. 12, it is understood that the sequential activation of the sense amplifier circuit arrays 7111 to 711n is effective against the peak current, and any malfunction due to the noise on the power and ground voltage lines does not take place in the dynamic randodm access memory device according to the present invention. The sequential activation prolongs the refreshing phase. However, the refreshing phase occupies a relatively small part rather than the read-out phase and the write-in phase, and the prolonged refreshing phase is ignorable.

While the dynamic random access memory device is staying in the read-out phase and the write-in phase, the sense amplifier circuit arrays 7111 to 711n are simultaneously powered by the control circuits 7211 to 721n as similar to the prior art dynamic random access memory device. However, if the rightmost column block address decoder/driver circuit 67n is coupled through an activation signal line with the leftmost column block address decoder/driver circuit 671, the sequential activation is achieved in the read-out phase and the write-in phase, and a data transfer from the selected bit line pairs to the input/output unit (not shown) is carried out during activation of the slected sense amplifier circuit array.

As will be appreciated from the foregoing description, the dynamic random access memory device according to the present invention sequentially powers only the sense amplifier circuit arrays in the selected row, and peak current flowing into the sense amplifier circuit arrays is decreased. As a result, the power voltage line and the ground voltage line are stable, and any malfunction hardly takes place.

Fourth Embodiment

Figure 14A:
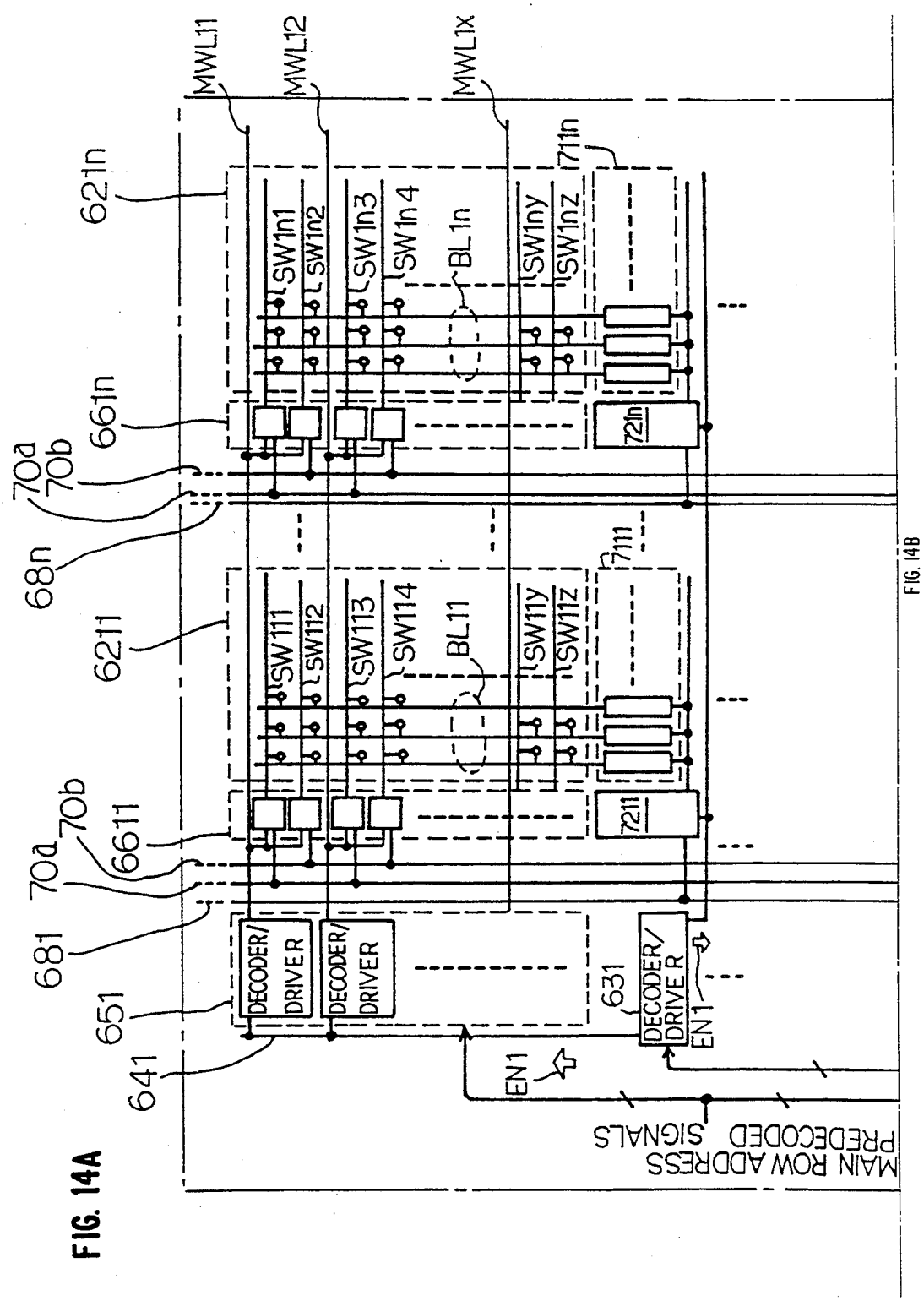
FIGS. 14A and 14B are a block diagram showing the arrangement of yet another dynamic random access memory device according to the present invention.
Figure 14B:
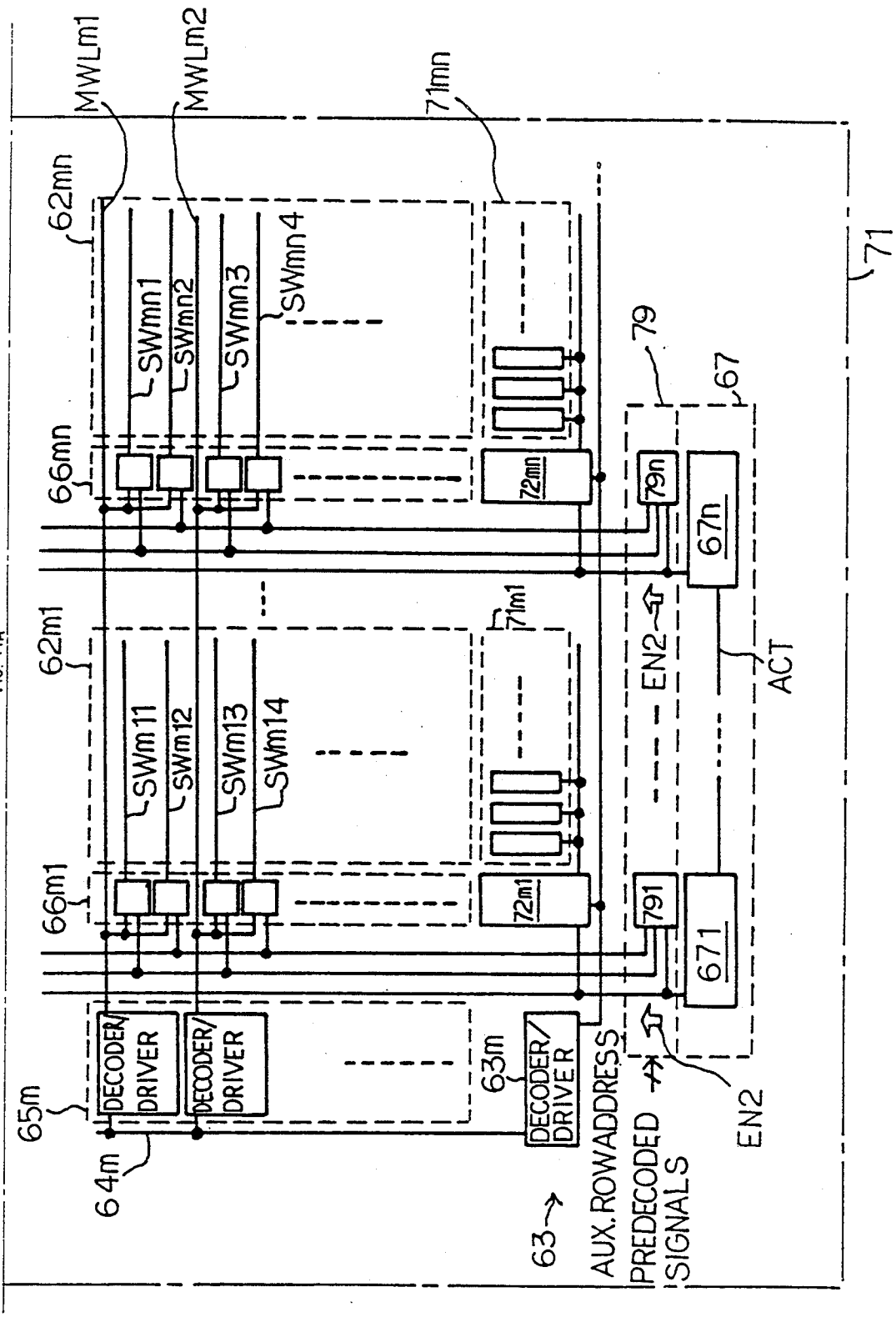

Turning to FIG. 14 of the drawings, still another dynamic random access memory device embodying the present invention is fabricated on a single semiconductor chip 71. The dynamic random access memory device implementing the fourth embodiemnt is similar to the third embodiemnt except for an auxiliary row address decoder unit 79, and the other component units and signal lines are labeled with the same references as the third embodiemnt.

The auxiliary row address decoder unit 79 has a plurality of auxiliary row address decoder circuits 791 to 79n, and a plurality sets of auxiliary row address decoded signal lines 701a/701b to 70na/70nb are respectively coupled with the auxiliary row address deocer circuits 791 to 79n. The auxiliary row address decoder circuits 791 to 79n are enabled with the second enable signal EN2, and become responsive to auxiliary row address predecoded signals. When the auxiliary row address decoder/driver circuits 791 to 79n are sequentially enabled with the second enable signal EN2, the auxiliary row address decoder/driver circuits 791 sequentially drive the auxiliary row address decoded signal lines 701a to 70na or 701b to 701b to the active high voltage level. Therefore, the sub-word line driver units assoicated with the selcted row of memory cell sub-arrays energize the sub-wrod lines at intervals, and the assoicated sense amplifier circuit arrys are also powered with the associated control circuits at intervals. This results in reduction of the peak current.

Figure 15:
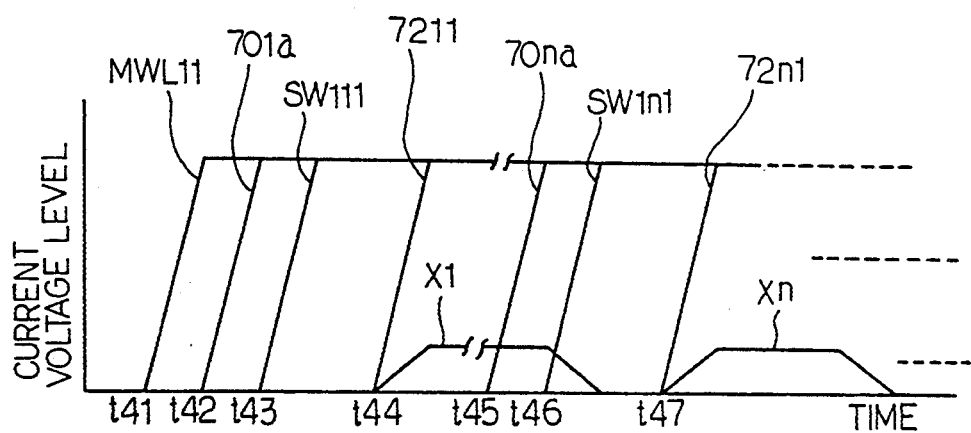
FIG. 15 is a graph showing the waveforms of essential signals in a refreshing phase and the current flowing into sense amplifier circuit arrays of the dynamic random access memory device shown in FIG. 14.

Description is made on a refreshing cycle with reference to FIG. 15. In the refreshing phase, the memory cells coupled with the sub-word lines SW111 to SW1n1 are assumed to be refreshed, and the row block address predecoded signals, the column block address predecoded signals, the main row address predecoded signals and the auxiliary row address predecoded signals are internally produced.

The row block address decoder unit 631 is responsive to the row block address predecoded signals for supplying the first enable signal EN1 to the main row address decoder/driver unit 651 and the control circuits 7211 to 721n, and the main row address decoder/driver unit 651 drives the main word line MWL11 to the active high voltage level at time t41 in response to the main row address predecoded signals.

The column block address decoder/driver circuit 671 is responsive to the column block address predecoded signals so that the second enable signal EN2 is firstly supplied from column block address decoder/driver circuit 671 through the decoded signal line 681 to the control circuits 7211 to 72ml and the auxiliary row address decoder/driver circuit 791.

The auxiliary row address decoder circuit 791 becomes responsive to the auxiliary row address predecoded signals, and drives the decoded signal line 701a at time t42. The uppermost driver circuit of the sub-word line driver unit 6611 is coupled with the main word line MWL11 and the decoded signal line 701a, and drives the sub-word line SW111 to the active high voltage level at time t43. The associated bit line pairs (not shown) have already charged and balanced, and date bits are read out from the memory cells coupled with the sub-word line SW111. Then, small potential differences take place on the bit line pairs BL11 to BL1n.

The control circuit 7211 is enabled with the second enable signal line EN2, and the sense amplifier circuit array 7111 is powered by the control circuit 7211 at time t44. Then, the small potential differences are increased in magnitude by the sense amplifier circuit array 7111, and the read-out data bits are, thereafter, restored into the memory cells coupled with the sub-word line SW111.

The current consumed by the sub-word line driver 6611 and the sense amplifier circuit array 7111 is labeled with "X1", and is smaller than that of the third embodiment.

Before the sense amplification at the array 7111 is completed, the column block address decoder/driver circuits sequentially enable the associated auxiliary row address decoder/driver circuits and the control circuits so that the data bits read out from the memory cells coupled with the energized sub-word lines are amplified at intervals.

Finally the block address decoder/driver circuit 67n supplies the second enable signal EN2 to the control circuit 721n and the auxiliary row address decoder/driver circuit 79n, and the auxiliary row address decoder/driver circuit 79n drives the decoded signal line 70na to the active high level at time t45. Then, the sub-word line driver unit 661n drives the sub-word line SW1n1 to the active high voltage level at time t46, and data bits are read out from the memory cells coupled therewith.

The control circuit 721n is enabled with the second enable signal EN2, and the sense amplifier circuit array 711n is powered by the control circuit 721n for amplifying the data bits at time t47. The data thus amplified are restored in the memory cells coupled with the sub-word line SW1n1. The total amount of current consumed by the sub-word line driver unit 661n and the sense amplifier circuit array 711n is labeled with "Xn", and is smaller than that of the third embodiment.

As will be appreciated from the foregoing description, the dynamic random access memory device according to the present invention stepwise activates the sub-word line driver units in the selected row and the associated control units, and the peak current is effectively decreased.

Fifth Embodiment

Figure 16:
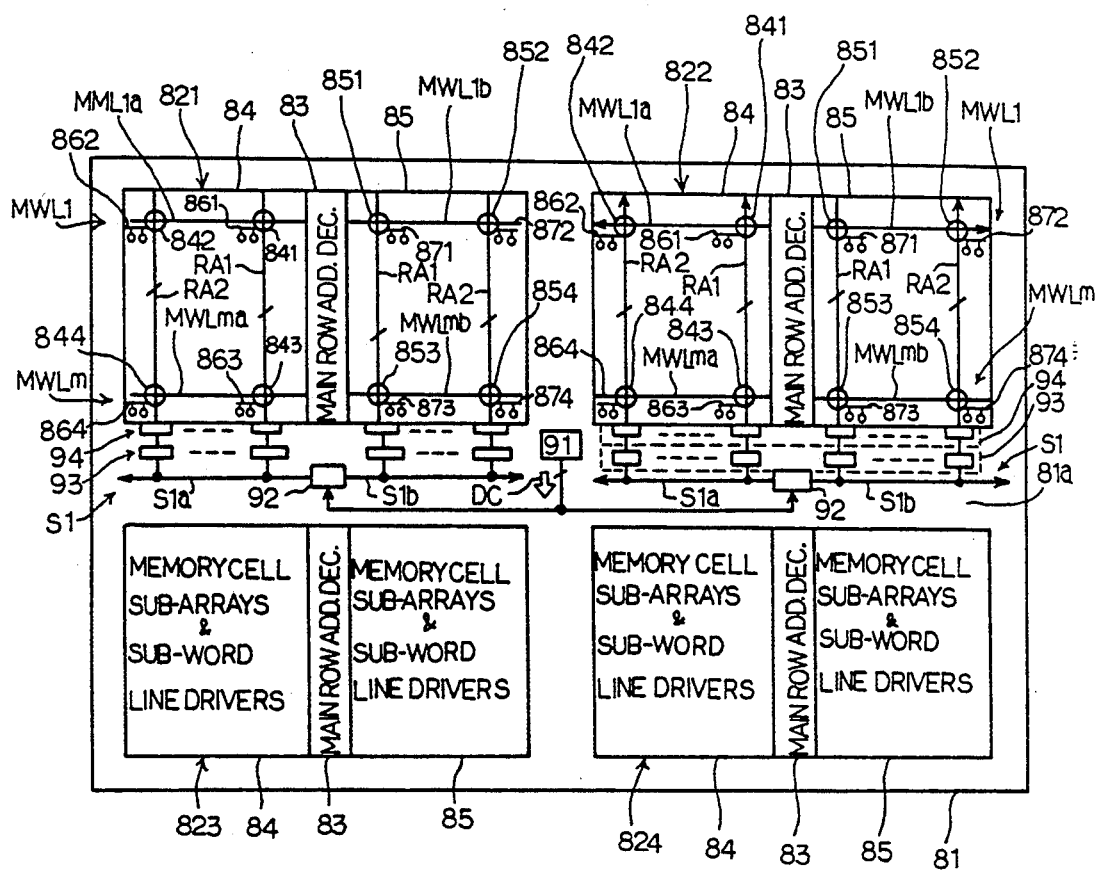
FIG. 16 is a plan view showing the layout of still another dynamic random access memory device according to the present invention.

Turning to FIG. 16 of the drawings, yet another dynamic random access memory device is fabricated on a single semiconductor chip 81, and four memory cell arrays 821 to 824 are located on the major surface of the semiconductor chip 81. Each of the memory cells 821 to 824 is spaced apart from the other memory cells, and an area 81a between the memory cell arrays 821/822 and 823/824 is assigned to peripheral circuits. All of the memory cell arrays 821 to 824 are similar in arrangement to one another.

Each of the memory cell arrays 821 to 824 comprises a main row address decoder unit 83, a plurality of main word lines MWL1 to MWLm, a first array 84 of memory cell sub-arrays 84 and sub-word line drivers alternately arranged and located on the left side of the main row address decoder 83 and a second array 85 of memory cell sub-arrays and sub-word line drivers alternately arranged and located on the right side of the main row address decoder 83.

Figure 4:
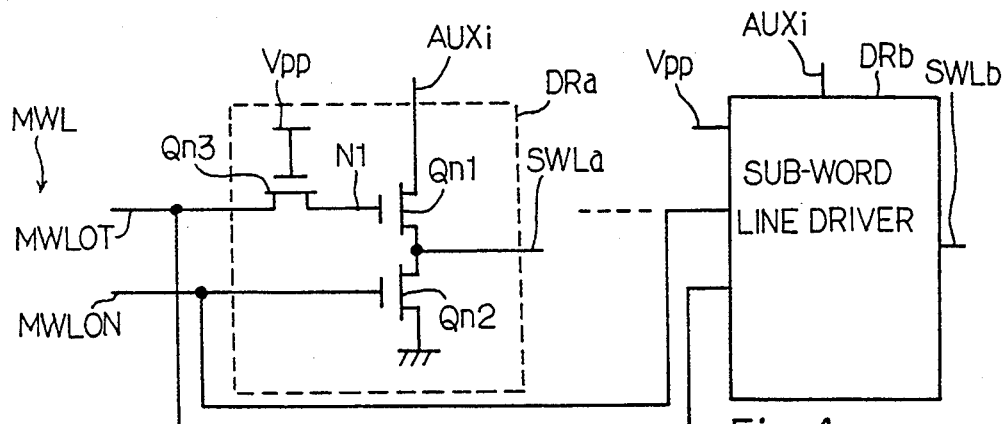
FIG. 4 is a circuit diagram showing the arrangement of the sub-word line driver incorporated in the aforesaid another dynamic random access memory device.
Figure 5:
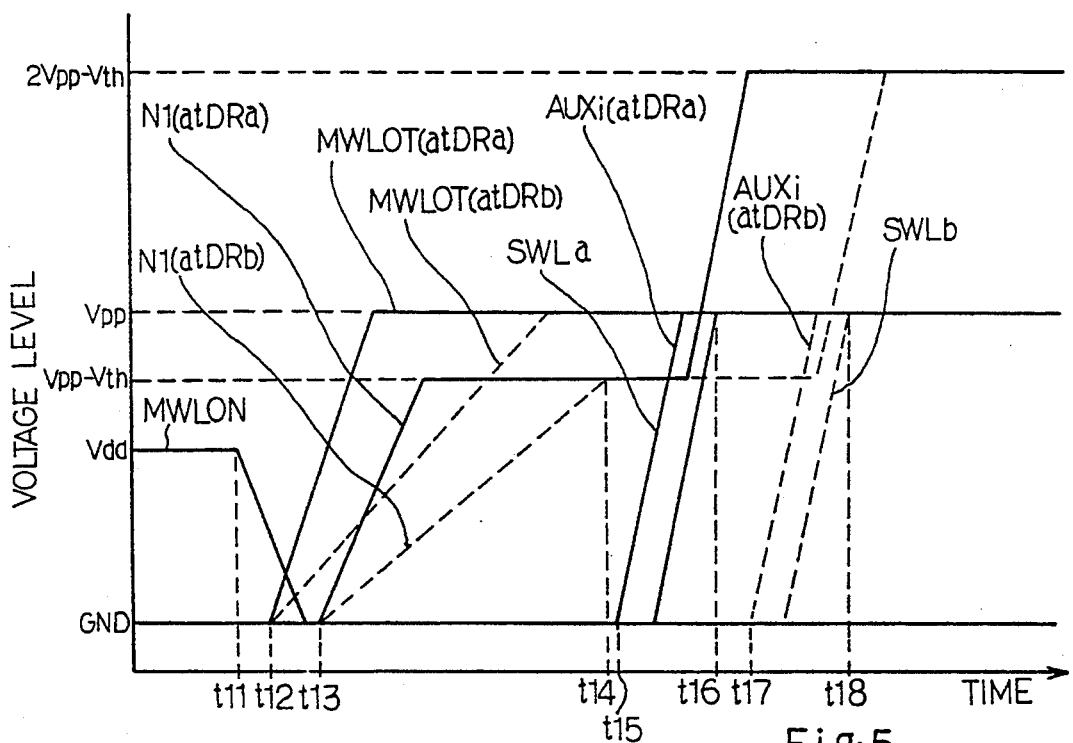
FIG. 5 is a graph showing the waveforms of the essential signal lines and on the nodes of the prior art dynamic random access memory device.
Figure 6:
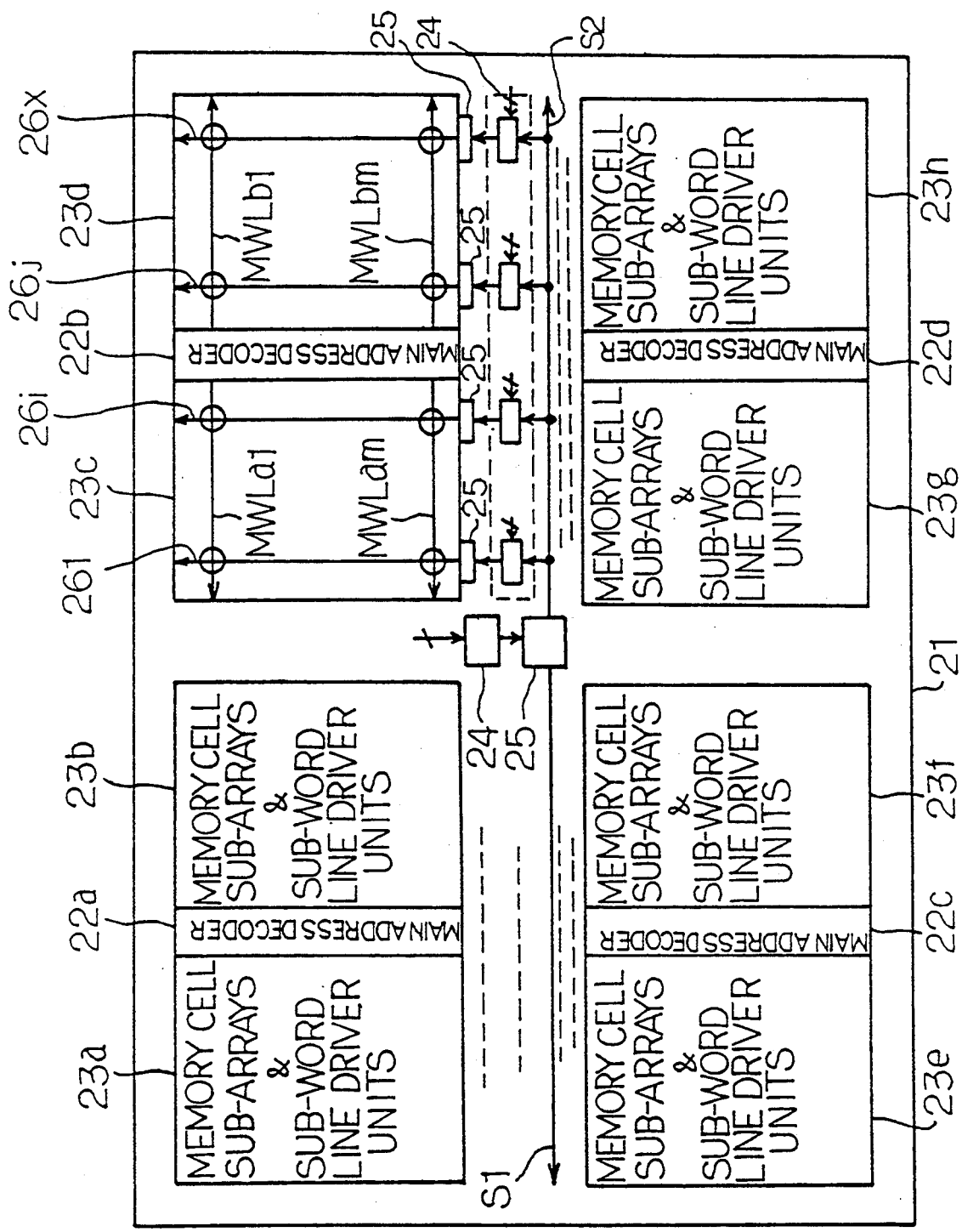
FIG. 6 is a block diagram showing the layout of yet another dynamic random access memory device.
Figure 7:
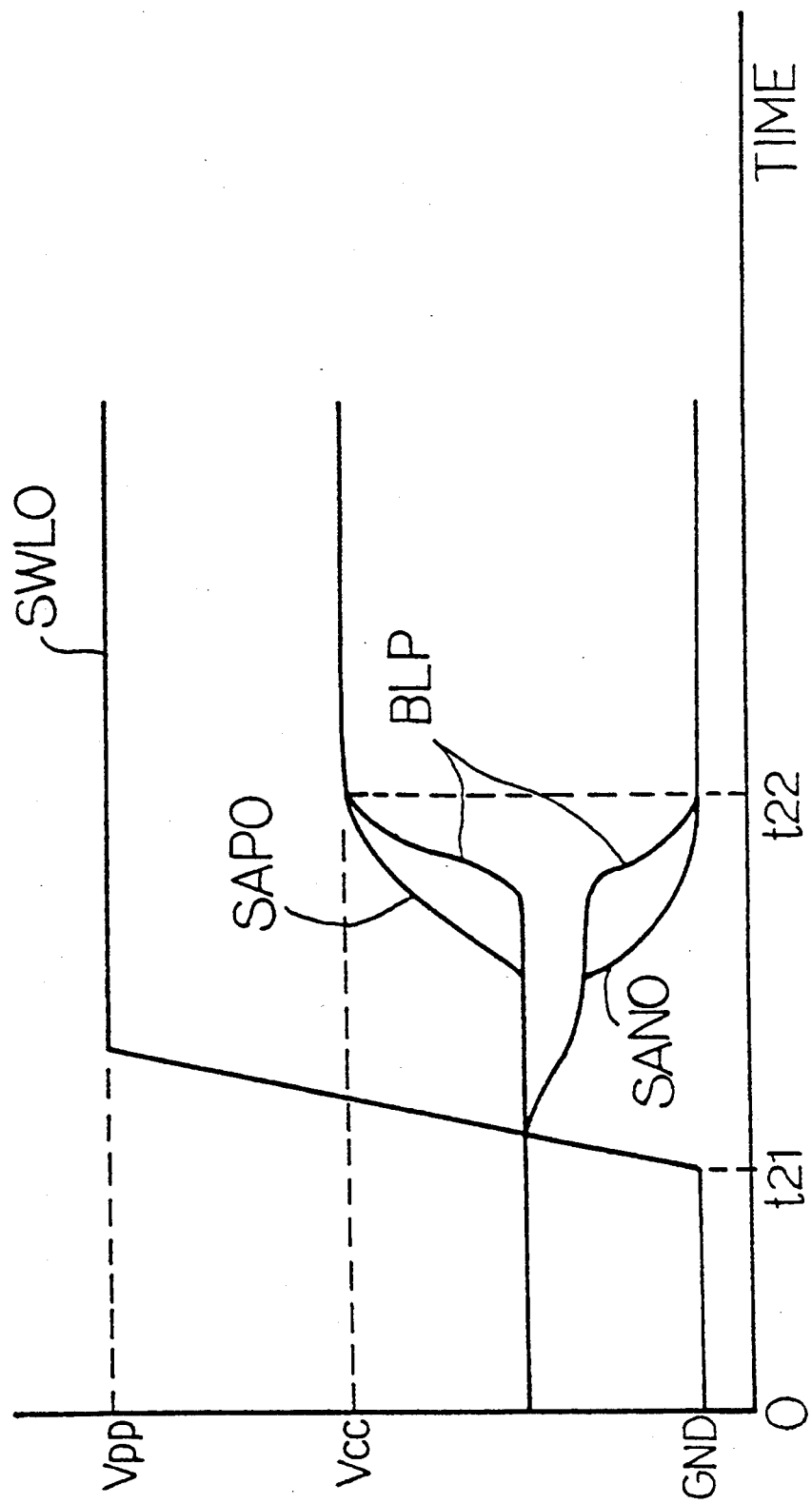
FIG. 7 is a graph showing the waveform of the essential signals for the dynamic random access memory device shown in FIG. 6.
Figure 8:
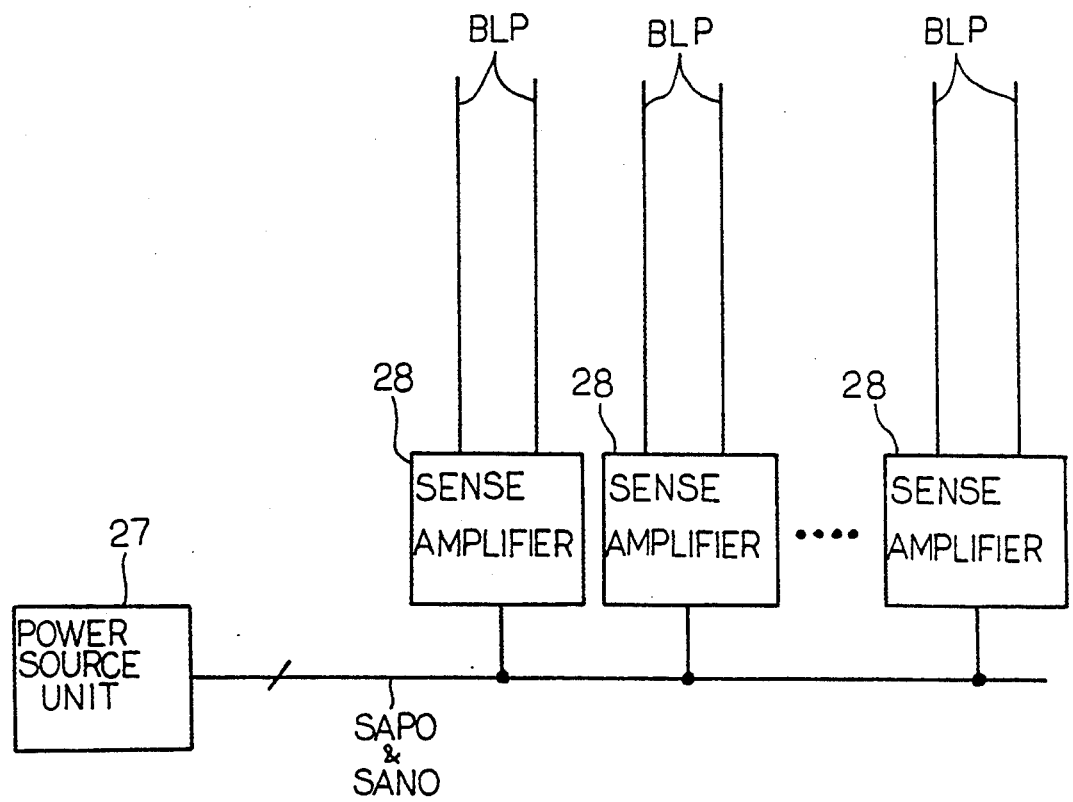
FIG. 8 is a block diagram showing the arrangement of the sense amplifier array and the power source unit incorporated in the dynamic random access memory device shown in FIG. 6.

The main word lines MWL1 to MWLm are split into left portions MWL1a to MWLmb associated the first array 84 and right portions MWL1b to MWLmb associated with the second array 85, and one of the main word lines, i.e., the left and right portions thereof are simultaneously driven to a positive power voltage level by the associated main row address decoder unit 83. The left portions MWL1a to MWLma are coupled with sub-word line drivers 841 to 844 of the first array 84, and the right portions MWL1b to MWLmb are also coupled with sub-word line drivers 851 to 854 of the second array 85. All of the sub-word line drivers 841 to 844 and 851 to 854 are similar to the sub-word line driver shown in FIG. 4.

Sub-word lines 861 to 864 and B71 to 874 are coupled with the sub-word line drivers 841 to 844 and 851 to 854, and are selectively driven to the high voltage level Vpp as similar to the sub-word line SWLa of the prior art.

A row of memory cells are associated with each of the sub-word lines 861 to 864 and 871 to 874, and the memory cells are represented by small bubbles in FIG. 16. The memory cells are of the one-transistor one-capacitor type, and columns of memory cells are respectively associated with bit line pairs (not shown). When a sub-word line is driven to the high voltage level Vpp, the capacitors of the associated memory cells are respectively conducted with the bit line pairs, and small potential differences take place on the bit line pairs as similar to the first to fourth embodiments.

Figure 17:
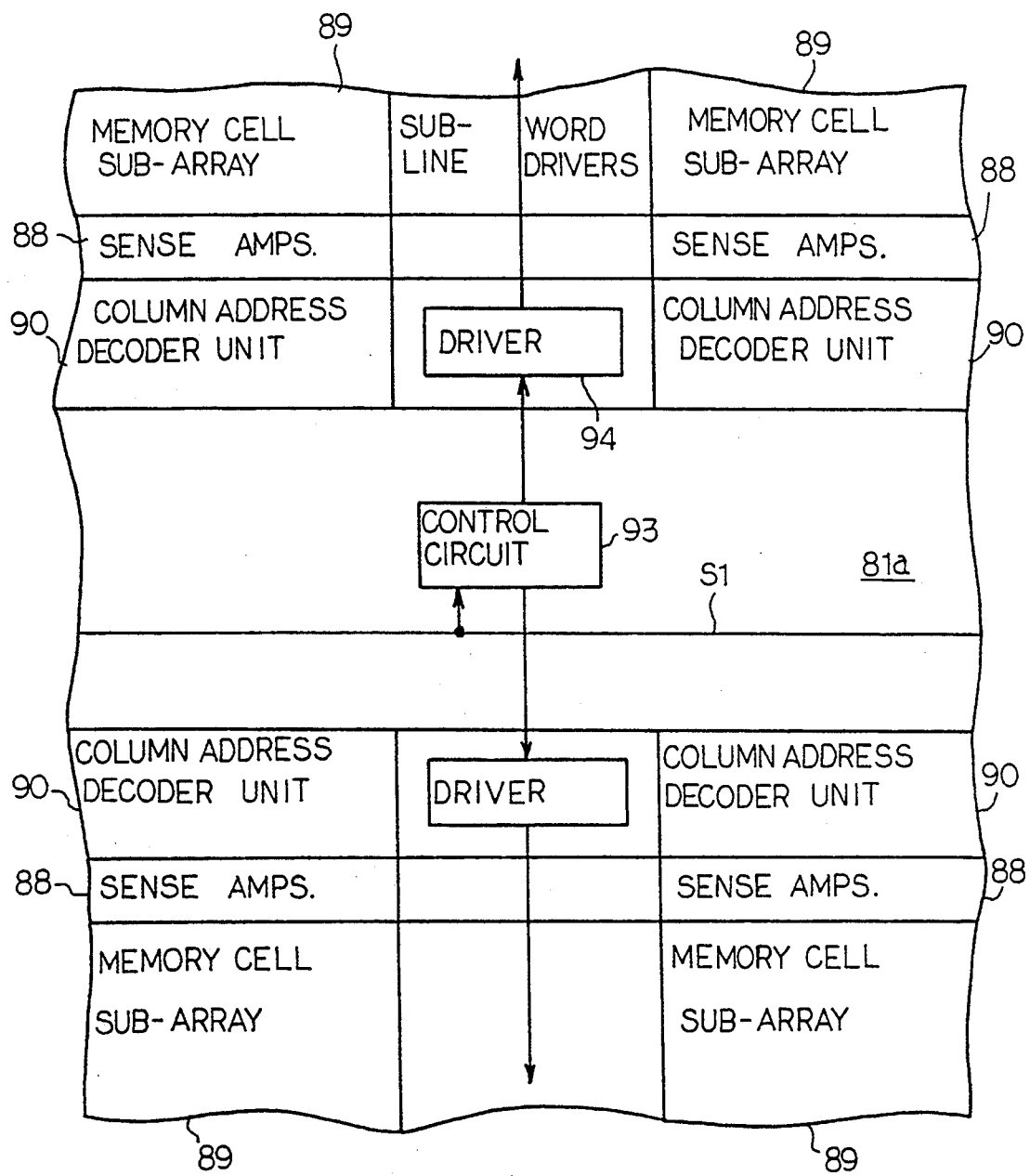
FIG. 17 is a plan view showing, an enlarged scale, a part of the dynamic random access memory device shown in FIG. 16.

As will be better seen in FIG. 17, sense amplifier circuits 88 are associated with the memory cell sub-array 89, and increase the small potential differences on the bit line pairs. The potential differences thus increased in magnitude are selectively transferred to an input/output unit (not shown) under the control of a column address decoder unit 90.

Turning back to FIG. 16, a block address decoder unit 91 is provided at the central sub-area of the area 81a, and is responsive to a block address predecoded signals for selecting one of the memory cell arrays 821 to 824, and the block address decoded signal DC is selectively supplied to driver units 92. An enable signal line S1 is driven by each of the driver units 92, and is split into two halves S1a and S1b. The two halves S1a and S1b extend in opposite directions from the driver unit 92 along the lateral boundary of the area assigned to each memory cell array 821, 822, 823 or 824.

An array of control circuits 93 is arranged along the enable signal line S1, and the control circuits 93 are respectively coupled with driver circuits 94. The driver circuits 94 are coupled with driving signal lines RA1 to RA2, and self-bootstrapping phenomenon takes place in the sub-word line driver in the presence of the high voltage level Vpp on the driving signal line RA1 or RA2. The two halves S1a and S1b propagate an enable signal to the control circuits 93, and the control circuits 93 cause the driver circuits 94 to supply the high voltage level Vpp to the driving signal lines RA1 to RA2.

Each of the driver units 92 is located at predetermined sub-areas confronted with the center of the lateral boundary of the area assigned to one of the memory cell arrays 821 to 824. In this instance, the main row address decoder unit 83 is placed at the central sub-area of the area assigned to the memory cell array, and the driver 92 is opposed to the main row address decoder 83. This feature is desirable, because the selected main word line propagates the high voltage level Vpp in the same direction as the enable signal on the enable signal line S1.

Figure 18:
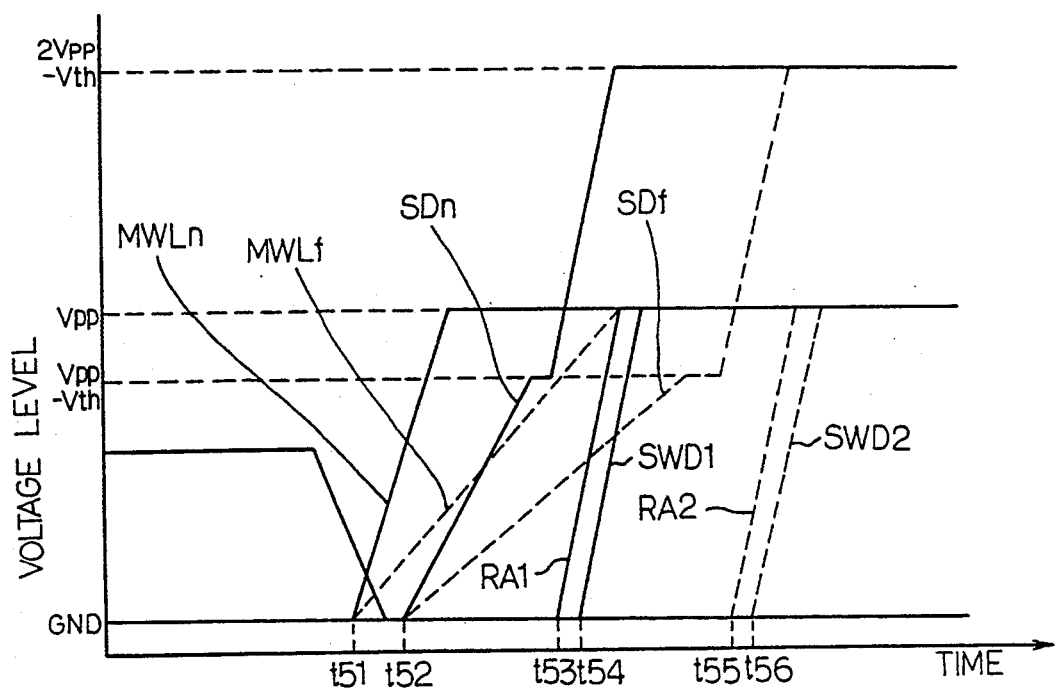
FIG. 18 is a graph showing the waveforms of essential signals of the dynamic random access memory device shown in FIG. 18.

Assuming now the main row address decoder 83 drives the main word line MWL1 toward the high voltage level at time t51 (see FIG. 18), the nearest point of the main word line MWL1 traces a real line MWLn, and the farthest point of the main word line MWL1 traces a broken line MWLf. The boosted point of the nearest sub-word line driver and the boosted point of the farthest sub-word line driver start rising at time t52, and trace a real line SDn and a broken line SDf, respectively. The driving signal lines RA1 and RA2 start rising at times t53 and t55, and the associated sub-word lines SWD1 and SWD2 start rising at times t54 and t56, respectively.

As described hereinbefore, signal propagation on the main word line MWL1 proceeds in the same direction as the signal propagation on the enable signal line S1. As a result, the amount of time delay between the nearest boosted point SDn and the farthest boosted point SDf can be regulated to the amount of time delay between the driving signal line RA1 and the driving signal line RA2, and the access speed is improved.

If the above described circuit arrangement is applied to a 256M-bit dynamic random access memory device, the dynamic random access memory device decreases the access time by 4 nanoseconds which is twice as long as the signal delay on the main word line.

Figure 19:
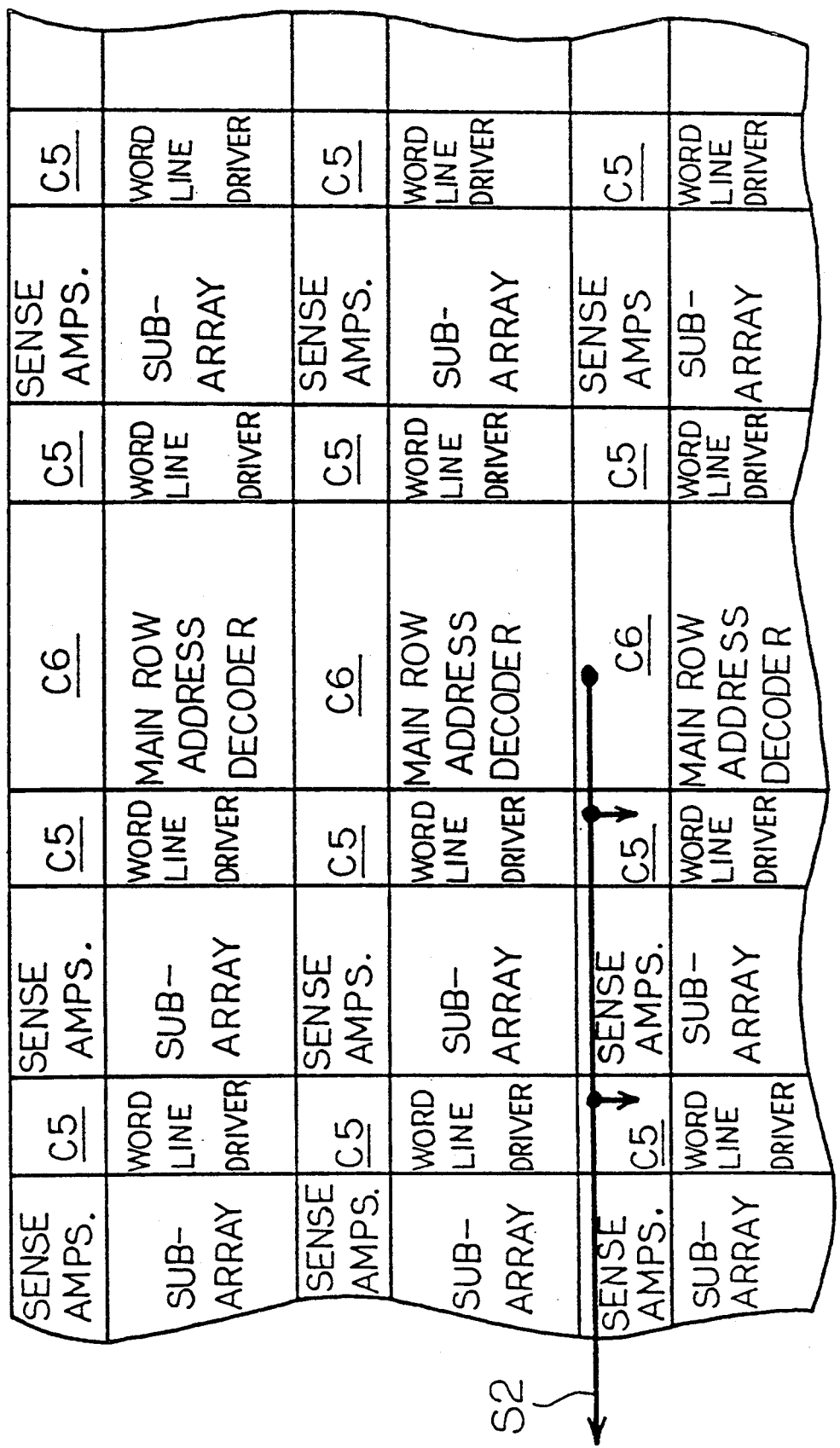
FIG. 19 is a plan view showing the layout of a modification of the dynamic random access memory device according to the present invention.

FIG. 19 shows a modification of the layout according to the present invention. C5 and C6 respectively designate power circuits for the sense amplifiers and driver circuits for the power circuits C5. Each of the driver circuits C6 activates the associated power circuits C5 through a signal line S2. Each of the driver circuits C6 is located at a crossing area between a column of the main row address decoder units and a row of sense amplifier circuits, and the signal line S2 passes over the sense amplifier circuits. Each of the power circuits C5 is located at a crossing area between a column of word line drivers and a row of the sense amplifier circuits.

This layout is desirable for a high-speed access, because the time delay between the boosted points SDn and SDf can be matched with the time delay between an activation of the nearest sense amplifier circuit and an activation of the farthest sense amplifier circuit coupled with the signal line S2.

A 256M-bit dynamic random access memory device usually has peripheral circuits fabricated on a laterally elongated area such as the central area 81a, and laterally extending wirings are usually formed of aluminum on the second level of a multi-level wiring structure. On the other hand, the main word lines are formed of aluminum on the first level of a multi-level wiring structure, because the aluminum wirings on the first level can be patterned narrower than those of the second level. The dispersion of patterning is independent between the first level and the second level, and it is difficult to perfectly adjust the signal delay on the main word lines and the enable signal line S1. However, if the enable signal lines S1 are formed as single-level aluminum wirings between the sense amplifier circuits and the column decoders, the dispersion equally affects. It is better to locate the enable signal line S1 between the column of column decoder units and the sense amplifiers in the nearest area to the peripheral circuits. In this instance, the enable signal line S1 is taken out between the column of the column decoders and the column of the word drivers, and is inputted to the control circuit 93.

Although particular embodiments of the present invention have been shown and described, it will be obvious to those skilled in the art that various changes and modifications may be made without departing from the spirit and scope of the present invention. For example, the present invention is applicable to any semiconductor memory device incorporating main word lines and sub-word lines into the addressing system. Moreover, the sequential activation of the sense amplifier circuit arrays may be applicable to a row decoder directly driving word lines coupled with memory cells.

What is claimed is:

1. A semiconductor memory device comprising:
a) a plurality of memory cell sub-arrays arranged in rows and columns, and each having a plurality of memory cells arranged in rows and columns, row block addresses being respectively assigned to the rows of memory cell sub-arrays, column block addresses being respectively assigned to the columns of memory cell sub-arrays;
b) a row block address decoder unit responsive to row block address predecoded signals indicative of one of said row block addresses, and producing a first enable signal from said row block address predecoded signals for one of said rows of memory cell sub-arrays;
c) a plurality of sets of main word lines respectively associated with said rows of memory cell sub-arrays, and each having main word lines;
d) a plurality of main row address decoder units respectively coupled with said plurality sets of main word lines, one of said plurality of main row address decoder units being enabled with said first enable signal for selectively driving said main word lines of the associated set in response to main row address predecoded signals;

e) a column block address decoder unit responsive to column block address predecoded signals indicative of one of said column block addresses, and producing a second enable signal from said column block address predecoded signals for one of said columns of memory cell sub-arrays;

f) a plurality of sets of auxiliary row address decoded signal lines respectively associated with said columns of memory cell sub-arrays, and each having auxiliary row address decoded signal lines;

g) a plurality of auxiliary row address decoder units respectively coupled with said plurality sets of auxiliary row address decoded signal lines, one of said plurality of auxiliary row address decoder units being enabled with said second enable signal for selectively driving said auxiliary row address decoded signal lines of the associated set to an active level in response to auxiliary row address predecoded signals;

h) a plurality of sets of sub-word lines respectively associated with said plurality of memory cell sub-arrays, and each having sub-word lines respectively coupled with the rows of memory cells of the associated memory cell sub-array;

i) a plurality of sub-word line driver units respectively associated with said plurality sets of sub-word lines, and each having a plurality of sub-word line driver circuits respectively coupled with said sub-word lines of the associated set, said main word lines of the associated set and said auxiliary row address decoded signal lines of the associated set being selectively coupled with said sub-word line drivers of one of said plurality of sub-word line driver units for driving one of said sub-word lines to an active level;

j) a plurality of sets of data propagation paths respectively associated with said plurality of memory cell sub-arrays, and each having data propagation paths respectively coupled with the columns of memory cells of the associated memory cell sub-array;

k) a plurality of sense amplifier circuit arrays respectively associated with said plurality of memory cell sub-arrays, and each having sense amplifier circuits respectively coupled with said data propagation paths of the associated set for amplifying data bits thereon; and l) a plurality of controlling units respectively associated with said plurality of sense amplifier circuit arrays, and enabled with said first and second enable signals for supplying electric power to the associated sense amplifier circuit array.

2. A semiconductor memory device as set forth in claim 1, in which further comprising:

a plurality of main enable signal lines respectively associated with said columns of memory cell sub-arrays, and each coupled with the controlling units associated with one of said columns of memory cell sub-arrays so as to simultaneously supply said second enable signal to said controlling units associated with the associated column of memory cell sub-arrays.

3. A semiconductor memory device as set forth in claim 2, in which further comprising:

a plurality of power supply lines each coupled between one of said sense amplifier circuit arrays and adjacent two of said controlling units associated with one of the rows of memory cell sub-arrays for supplying electric power from said two of said controlling units; and a plurality of auxiliary enable signal lines each coupled between one of said plurality of main enable signal lines and the controlling unit associated with an adjacent column of memory cell sub-arrays in the same row of memory cell sub-arrays for specifying the sense amplifier circuit array to be powered together with the associated main enable signal line.

4. A semiconductor memory device comprising:

a) a plurality of memory cell sub-arrays arranged in rows and columns, and each having a plurality of memory cells arranged in rows and columns, row block addresses being respectively assigned to the rows of memory cell sub-arrays, column block addresses being respectively assigned to the columns of memory cell sub-arrays;

b) a row block address decoder unit responsive to row block address predecoded signals indicative of one of said row block addresses, and producing a first enable signal from said row block address predecoded signals for one of said rows of memory cell sub-arrays;

c) a plurality of sets of main word lines respectively associated with said rows of memory cell sub-arrays, and each having main word lines;

d) a plurality of main row address decoder units respectively coupled with said plurality sets of main word lines, one of said plurality of main row address decoder units being enabled with said first enable signal for selectively driving the main word lines of the associated set to an active level in response to main row address predecoded signals;

e) a plurality of auxiliary row address decoded signal lines shared between said plurality of memory cell sub-arrays;

f) an auxiliary row address decoder unit coupled with said plurality of auxiliary row address decoded signal lines, and selectively driving the auxiliary row address decoded signal lines to an active level in response to auxiliary row address predecoded signals;

g) a plurality of sets of sub-word lines respectively associated with said plurality of memory cell sub-arrays, and each having sub-word lines respectively coupled with the rows of memory cells of the associated memory cell sub-array;

h) a plurality of sub-word line driver units respectively coupled with said plurality sets of sub-word lines, and each having a plurality of sub-word line driver circuits respectively coupled with said sub-word lines of the associated set, said main word lines of each set and said auxiliary row address decoded signal lines being selectively coupled with said sub-word line drivers of one of said plurality of sub-word line driver units for driving one of said sub-word lines of each memory cell sub-arrays of one of said rows of memory cell sub-arrays to active level;

i) a plurality of sets of data propagation paths respectively associated with said plurality of memory cell sub-arrays, and each having data propagation paths respectively coupled with the columns of memory cells of the associated memory cell sub-array;

j) a plurality of sense amplifier circuit arrays respectively associated with said plurality of memory cell sub-arrays, and each having sense amplifier circuits respectively coupled with said data propagation paths of the associated set for amplifying data bits thereon;

k) a plurality of controlling units respectively associated with said plurality of sense amplifier circuit arrays, and enabled with said first enable signal and a second enable signal for supplying electric power to the associated sense amplifier circuit array; and l) a means for supplying said second enable signal to the controlling units associated with said one of said rows of memory cell sub-arrays having the sub-word lines driven to said active level at intervals.

5. A semiconductor memory device as set forth in claim 4, in which said means comprises:

a column block address decoder/driver unit having a plurality of block address decoder/driver circuits respectively associated with said columns of memory cell sub-arrays, and responsive to column block address predecoded signals indicative of one of said column block addresses for producing said second enable signal, each of said column block address decoder/driver circuits further producing an activation signal after production of said second enable signal, each of said column block address decoder/driver circuits being further responsive to said activation signal for producing said second enable signal;

a plurality of column block address decoded signal lines each coupled with the controlling units associated with one of said columns of memory cell sub-arrays for propagating said second enable signal thereto; and a plurality of activation signal lines each coupled between adjacent two column block address decoder/driver circuits selected from said plurality of column block address decoder/driver circuits, and propagating said activation signal from one of said adjacent two column block address decoder/driver circuits to the other of said adjacent block address decoder/driver circuits.

6. A semiconductor memory device as set forth in claim 5, in which said auxiliary row address decoded signal lines comprises respective auxiliary row address decoded signal sub-line groups associated with said columns of memory cell sub-arrays and each having a plurality of auxiliary row address decoded sub-lines, and in which said auxiliary row address decoder unit comprises a plurality of auxiliary row address decoder circuits respectively coupled with said auxiliary row address decoded signal sub-line groups and supplied with said second enable signal from said plurality of column block address decoder circuits, said auxiliary row address decoder circuits enabled with said second enable signal becoming responsive to said auxiliary row address predecoded signal.

7. A semiconductor memory device fabricated on a single semiconductor chip, comprising: a plurality of memory cell arrays located in respective peripheral areas of a major surface of said semiconductor chip; a decoder unit located at a central area between said peripheral areas, and responsive to address predecoded signals for producing a decoded signal; first driver units each located at said central area, and responsive to said decoded signal for producing an enable signal; and a plurality of enable signal lines respectively driven by said first driver units, each of said plurality of memory cell arrays comprising a) a plurality of main word lines having respective first portions and respective second portions, b) a main row address decoder unit located in a central sub-area of one of said peripheral areas, and coupled with said first portions extending on one side thereof and with said second portions extending on the other side thereof, and responsive; to main row address predecoded signals for selectively driving said plurality of main word lines, c) a first array of first memory cell sub-arrays and first sub-word line driver units alternately arranged, and located on a first sub-area of said one of said peripheral areas located on said one side of said main row address decoder unit, said first portions being selectively coupled with said first sub-word line drivers, d) a second array of second memory cell sub-arrays and second sub-word line driver units alternately arranged, and located on a second sub-area of said one of said peripheral areas located on said other side of said main row address decoder unit, said second portions being selectively coupled with said second sub-word line drivers, one of said first driving units being confronted with said main row address decoder unit, one of said enable signal lines having two halves respectively extending along a boundary between said first sub-area and said central area and a boundary between said second sub-area and said central area, e) a plurality of first driving signal lines extending from said central area over said first sub-area, and selectively coupling said first sub-word line driver unit for causing a self-bootstrapping phenomenon to take place in said first sub-word line driver unit, thereby selectively boosting first sub-word lines coupled therewith over a power voltage level, and f) a plurality of second driving signal lines extending from said central area over said second sub-area, and selectively coupling said second sub-word line driver unit for causing said self-bootstrapping phenomenon to take place in said second sub-word line driver unit, thereby selectively boosting second sub-word lines coupled therewith over a power voltage level, said semiconductor memory device further comprising: a plurality of control units enabled with said enable signal lines, one of said plurality of control units having a plurality of first control circuits arranged along one of said two halves of one of said enable signal lines and coupled with said one of said two halves, and a plurality of second control circuits arranged along the other of said two halves of said one of said enable signal lines and coupled with said the other of said two halves; and a plurality of second driving units respectively associated with said plurality of memory cell arrays, one of said second driving units having a plurality of second driving circuits coupled with said first: and second control circuits, respectively, and coupled with said driving signal lines for sequentially supplying a bootstrapping signal.

* * * * *

UNITED STATES PATENT AND TRADEMARK OFFICE
CERTIFICATE OF CORRECTION

PATENT NO. : 5,406,526　　　　　　　　　　　　Page 1 of 5
DATED : April 11, 1995
INVENTOR(S) : Tadahiko Sugibayashi, et al It is certified that error appears in the above-indentified patent and that said Letters Patent is hereby corrected as shown below:

Column 2, Line 60, delete "sub-ward" and insert --sub-word--.

Column 3, Line 12, delete "sub-ward" and insert --sub-word--.

Column 3, Line 14, delete "sub-ward" and insert --sub-word--.

Column 4, Line 17, delete "arty" and insert --art--.

Column 5, Line 66, delete "sub-ward" and insert --sub-word--.

Column 6, Line 2, delete "sub-ward" and insert --sub-word--.

Column 6, Line 3, delete "bus-ward" and insert --bus-word--.

Column 9, Line 56, delete "1" and insert --l--.

Column 12, Line 57, delete "32ml" and insert --32m1--.

Column 13, Line 8, delete "Co" and insert --to--.

UNITED STATES PATENT AND TRADEMARK OFFICE
CERTIFICATE OF CORRECTION

PATENT NO. : 5,406,526
DATED : April 11, 1995
INVENTOR(S) : Tadahiko Sugibayashi, et al It is certified that error appears in the above-indentified patent and that said Letters Patent is hereby corrected as shown below:

Column 16, Line 10, delete "predecided" and insert --predecoded--.

Column 16, Lines 12 and 13, delete "intenally" and insert --internally--.

Column 16, Line 37, delete "assoicated" and insert --associated--.

Column 16, Line 38, delete "dynamci" and insert --dynamic--.

Column 16, Line 40, delete "embodiemnt" and insert --embodiment--.

Column 16, Line 44, delete "signa" and insert --signal--.

Column 16, Line 44, delete "labled" and insert --labeled--.

Column 16, Line 47, delete "embodiemnt" and insert --embodiment--.

Column 16, Line 50, delete "assoicated" and insert --associated--.

Column 16, Line 52, delete "exept" and insert --except--.

UNITED STATES PATENT AND TRADEMARK OFFICE
CERTIFICATE OF CORRECTION

PATENT NO. : 5,406,526

DATED : April 11, 1995

INVENTOR(S) : Tadahiko Sugibayashi, et al

It is certified that error appears in the above-indentified patent and that said Letters Patent is hereby corrected as shown below:

Column 16, Line 53, delete "brached" and insert --branched--.

Column 16, Line 55, delete "leach" and insert --each--.

Column 16, Line 57, delete "assoicated" and insert --associated--.

Column 17, Line 2, delete "assoicated" and insert --associated--.

Column 17, Line 4, delete "assoicated" and insert --associated--.

Column 17, Line 6, delete "circutis" and insert --circuits--.

Column 17, Line 7, delete "ampifiler circut" and insert --amplifier circuit--.

Column 17, Line 10, delete "embodiemnt" and insert --embodiment-.

Column 19, Line 40, delete "mans" and insert --means--.

Column 20, Line 27, delete "72ran" and insert --72mn--.

UNITED STATES PATENT AND TRADEMARK OFFICE
CERTIFICATE OF CORRECTION

PATENT NO. : 5,406,526
DATED : April 11, 1995
INVENTOR(S) : Tadahiko Sugibayashi, et al It is certified that error appears in the above-indentified patent and that said Letters Patent is hereby corrected as shown below:

Column 21, Line 21, delete "date" and insert --data--.

Column 22, Line 2, delete "wrod" and insert --word--.

Column 22, Line 12, delete "randodm" and insert --random--.

Column 22, Line 30, delete "slected" and insert --selected--.

Column 22, Line 46, delete "embodiemnt" and insert --embodiment-.

Column 22, Line 47, delete "embodiemnt" and insert --embodiment-.

Column 22, Line 50, delete "embodiemnt" and insert --embodiment-.

Column 22, Line 55, delete "deocer" and insert --decoder--.

Column 22, Line 66, delete "assoicated" and insert --associated--.

Column 22, Line 66, delete "selcted" and insert --selected--.

UNITED STATES PATENT AND TRADEMARK OFFICE
CERTIFICATE OF CORRECTION

PATENT NO. : 5,406,526
DATED : April 11, 1995
INVENTOR(S) : Tadahiko Sugibayashi, et al It is certified that error appears in the above-indentified patent and that said Letters Patent is hereby corrected as shown below:

Column 22, Line 67, delete "wrod" and insert --word--.

Column 22, Line 68, delete "assoicated" and insert --associated--.

Column 22, Line 68, delete "arrys" and insert --arrays--.

Column 23, Line 34, delete "date" and insert --data--.

Signed and Sealed this

Nineteenth Day of September, 1995

Attest:

BRUCE LEHMAN

*Attesting Officer*     *Commissioner of Patents and Trademarks*